United States Patent
Davies et al.

(10) Patent No.: US 11,067,482 B2
(45) Date of Patent: Jul. 20, 2021

(54) APPLIANCE OPERATION SIGNAL PROCESSING SYSTEM AND METHOD

(71) Applicant: Green Running Limited, Bath (GB)

(72) Inventors: Peter Gareth Davies, Bath (GB); Conrad Spiteri, London (GB)

(73) Assignee: Green Running Limited, Bath (GB)

( * ) Notice: Subject to any disclaimer, the term of this patent is extended or adjusted under 35 U.S.C. 154(b) by 0 days.

(21) Appl. No.: 16/489,535

(22) PCT Filed: Feb. 28, 2018

(86) PCT No.: PCT/GB2018/050516
§ 371 (c)(1),
(2) Date: Aug. 28, 2019

(87) PCT Pub. No.: WO2018/158570
PCT Pub. Date: Sep. 7, 2018

(65) Prior Publication Data
US 2020/0003659 A1  Jan. 2, 2020

(30) Foreign Application Priority Data

Feb. 28, 2017 (GB) .................................... 1703178

(51) Int. Cl.
*G06N 3/04* (2006.01)
*G06N 3/08* (2006.01)
(Continued)

(52) U.S. Cl.
CPC ............ *G01M 99/005* (2013.01); *G01H 1/00* (2013.01); *G01R 21/133* (2013.01); *G06N 3/04* (2013.01);
(Continued)

(58) Field of Classification Search
None
See application file for complete search history.

(56) References Cited

U.S. PATENT DOCUMENTS 6,826,267 B2 * 11/2004 Daum ................. H04L 12/2803
340/12.53
9,159,217 B1 * 10/2015 Logan .................. G05B 19/042
(Continued)

FOREIGN PATENT DOCUMENTS

| CN | 104237737 A | 12/2012 |
| CN | 104316844 A | 1/2015 |

(Continued)

OTHER PUBLICATIONS

International Search Report for International Application No. PCT/GB2018/050516, dated May 29, 2018 (4 pages).
(Continued)

*Primary Examiner* — Roy Y Yi
(74) *Attorney, Agent, or Firm* — Nixon Peabody LLP

(57) ABSTRACT

An appliance operation signal processing system including an input for receiving an appliance operation signal. The appliance operation signal includes information relating to operation of an appliance. The system further includes an output for outputting information relating to degradation of the appliance and a processor configured to determine a probability that the appliance or a component of the appliance is in at least one degradation state by applying a classifier to a feature vector including information relating to frequency data extracted from the appliance operation signal.

27 Claims, 14 Drawing Sheets

(51) Int. Cl.
  *G06N 20/00* (2019.01)
  *G01H 1/00* (2006.01)
  *G01R 21/133* (2006.01)
  *G01M 99/00* (2011.01)

(52) U.S. Cl.
  CPC ............ *G06N 3/084* (2013.01); *G01H 1/003* (2013.01); *G06N 20/00* (2019.01)

(56) References Cited

U.S. PATENT DOCUMENTS

| | | | |
|---|---|---|---|
| 9,250,101 | B2 | 2/2016 | Davies |
| 9,697,069 | B2 * | 7/2017 | Lee ................ G06F 11/079 |
| 2014/0129160 | A1 | 5/2014 | Tran |
| 2014/0347077 | A1 | 11/2014 | Donaldson |
| 2015/0046130 | A1 | 2/2015 | Fei |
| 2015/0185262 | A1 | 7/2015 | Song |
| 2016/0080840 | A1 | 3/2016 | Haghighat-Kashani |
| 2016/0148099 | A1 | 5/2016 | Micali |
| 2016/0156225 | A1 | 6/2016 | Yang |
| 2018/0136995 | A1 * | 5/2018 | Sheppard ......... G06F 11/0709 |

FOREIGN PATENT DOCUMENTS

| | | |
|---|---|---|
| EP | 2026299 A1 | 2/2009 |
| EP | 2528033 A1 | 11/2012 |
| GB | 2475172 A | 5/2011 |
| GB | 2488164 A | 8/2012 |
| WO | WO 2016/037095 A1 | 3/2016 |

OTHER PUBLICATIONS

Written Opinion of International Searching Authority for International Application No. PCT/EP2018/057172, dated May 29, 2018 (7 pages).
Gao, J. et al.; "A feasibility study of automated plug-load identification from high-frequency measurements"; 2015 IEEE Global Conference on Signal and Information Processing (GlobalSIP); Dec. 14, 2015, pp. 220-224; XP032871650 (5 pages).
Ferrandez-Pastor, F. J. et al.; "Interpreting human activity from electrical consumption data using reconfigurable hardware and hidden Markov models"; J. Ambient Intell. and Human. Comput., vol. 8, No. 4, pp. 469-483; Nov. 22, 2016; XP036272790 (15 pages).
Berges, M. et al.; "User-centered non-intrusive electricity load monitoring for residential buildings"; J. Computing in Civil Engineering; Amer. Society of Civil Engineers, Bol. 25, No. 6, pp. 471-480; Nov. 1, 2011; XP0091182171 (11 pages).

* cited by examiner

Drain Test — Power RMS Image (x = Power, Watts, y = time, Seconds)

Unrestricted drain pipe

Drain pipe restricted to 2mm

Blocked drain pipe

APPLIANCE OPERATION SIGNAL PROCESSING SYSTEM AND METHOD

CROSS-REFERENCE TO RELATED APPLICATIONS

This application is a national stage of Application No. PCT/GB2018/050516 filed Feb. 28, 2018, and claims the benefit of priority from United Kingdom Application number 1703178.2 filed on Feb. 28, 2017, which are both incorporated by reference in their entireties.

FIELD

The present invention relates to an appliance operation signal processing system and method.

BACKGROUND

Numerous power monitoring devices are available.

It is desirable, for various reasons, to know the status of an electrical appliance and to identify any degradation of the appliance or its internal components, whether by means of wear-and tear, misuse or through other methods.

BRIEF DESCRIPTION OF THE DRAWINGS

For a more complete understanding of the invention, reference is made to the following description and accompanying drawings, in which.

DETAILED DESCRIPTION

Figure 1:
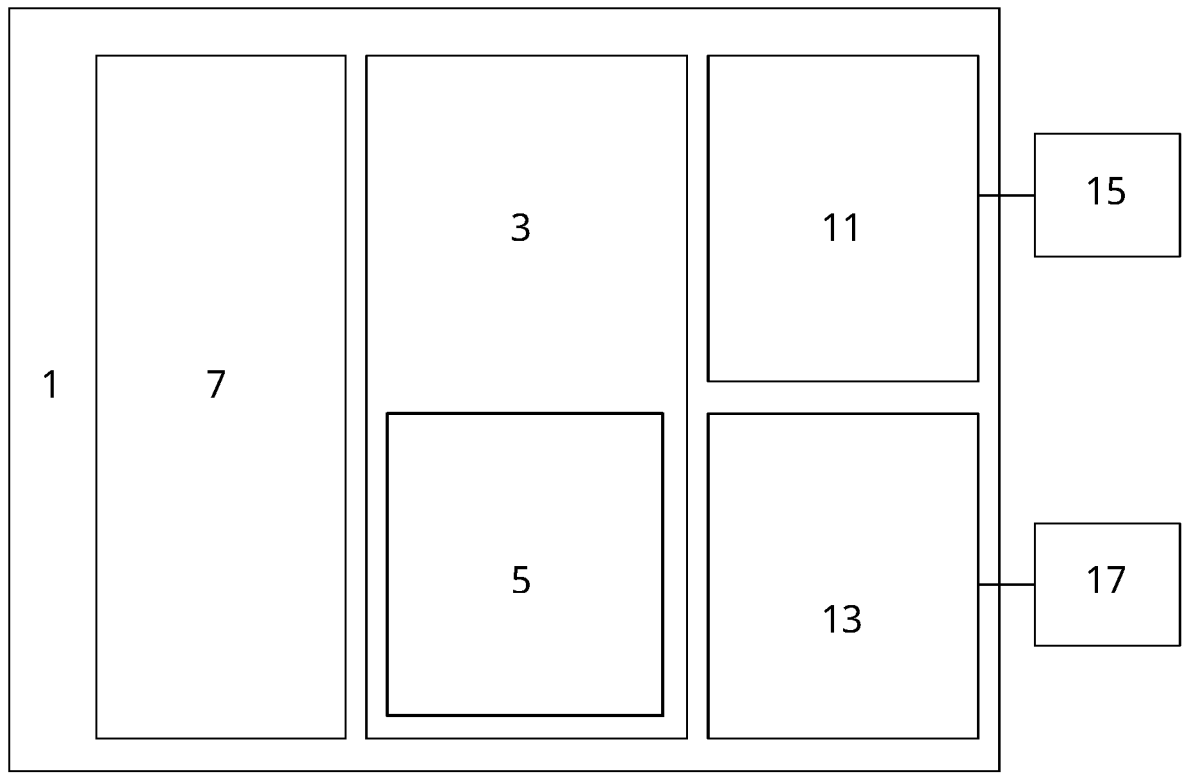
FIG. 1 is a schematic illustration of an appliance operation signal processing system in accordance with an embodiment.

According to one embodiment, there is provided an appliance operation signal processing system comprising:
  an input for receiving an appliance operation signal, the appliance operation signal comprising information relating to operation of an appliance;
  an output for outputting information relating to degradation of the appliance; and
  a processor configured to determine a probability that the appliance or a component of the appliance is in the or each of one or more degradation states, by applying a classifier to a feature vector comprising information relating to frequency data extracted from the appliance operation signal.

The processor may be further configured to:
  monitor an input appliance operation signal for a change in magnitude;
  if a change is detected:
    extract a first section of the input signal, the first section being a section of the signal from a location prior to the detected change to a location after the detected change;
    extract a pre-event portion of the first section, the pre-event portion being at least a part of the first section of the signal prior to the change;
    extract a post-event portion of the first section, the post-event portion being at least a part of the first section of the signal after the change;
    transform each of the pre-event portion and the post-event portion into the frequency domain;
    subtract one of the frequency domain pre-event portion and the frequency domain post-event portion from the other of the frequency domain pre-event portion and the frequency domain post-event portion to give resultant frequency data;
  wherein the frequency data extracted from the appliance operation signal is the resultant frequency data.

In an embodiment, transforming each of the pre-event portion and the post-event portion into the frequency domain comprises using a fast Fourier transform.

In an embodiment, the information relating to the resultant frequency data comprises the amplitude value corresponding to one or more harmonic frequencies.

In an embodiment, the appliance operation signal is an electrical power signal and the fundamental frequency is 50 Hz or 60 Hz.

The processor may be further configured to:
  subtract a time domain signal corresponding to one of the pre-event portion and the post-event portion from a time domain signal corresponding to the other of the pre-event portion and the post-event portion to give resultant time domain data, wherein the feature vector further comprises information relating to the resultant time domain data.

According to another embodiment, there is provided an appliance operation signal processing system comprising:

an input for receiving an appliance operation signal, the appliance operation signal comprising information relating to operation of an appliance;

an output for outputting information relating to degradation of the appliance; and a processor configured to determine a probability that the appliance is in the or each of one or more degradation states, by applying a classifier to a feature vector comprising information relating to time domain data extracted from the appliance operation signal.

The processor may be further configured to:

monitor an input appliance operation signal for a change in magnitude;

if a change is detected:

extract a first section of the input signal, the first section being a section of the signal from a location prior to the detected change to a location after the detected change;

extract a pre-event portion of the first section, the pre-event portion being at least a part of the first section of the signal prior to the change;

extract a post-event portion of the first section, the post-event portion being at least a part of the first section of the signal after the change;

subtract one of the pre-event portion and the post-event portion from the other of the pre-event portion and the post-event portion to give resultant time domain data;

wherein the time domain data extracted from the appliance operation signal is the resultant time domain data.

The processor may be further configured to:

transform each of a time domain signal corresponding to the pre-event portion and a time domain signal corresponding to the post-event portion into the frequency domain;

subtract one of the frequency domain pre-event portion and the frequency domain post-event portion from the other of the frequency domain pre-event portion and the frequency domain post-event portion to give resultant frequency data, wherein the feature vector further comprises information relating to the resultant frequency data.

In an embodiment, the frequency data is a frequency spectrum.

In an embodiment, monitoring the input appliance operation signal for a change in magnitude comprises monitoring for a change in magnitude greater than a change threshold value.

The processor may be further configured to extract information relating to the duration of time between detected changes for the appliance, wherein the feature vector further comprises the extracted information relating to the duration of time between events.

In an embodiment, the appliance consumes electrical power, and wherein the appliance operation signal comprises an electrical current signal and/or an electrical voltage signal and/or an electrical power signal.

In an embodiment, the appliance consumes water and the appliance operation signal comprises a water consumption signal.

The processor may be further configured to, if a change is detected in an electrical signal, determine, from the water consumption signal, the amount of water contained in the appliance at the time of the change, wherein the feature vector further comprises information relating to amount of water contained in the appliance.

In an embodiment, the appliance consumes gas and wherein the appliance operation signal comprises a gas consumption signal.

The classifier may be a machine learning classifier, i.e. a trained classifier.

In an embodiment, the appliance operation signal comprises information relating to utility consumption of a plurality of appliances and wherein the processor is further configured to identify the appliance corresponding to a detected event.

The classifier may be further configured to determine a probability that the detected event corresponds to the or each of one or more appliances.

The appliance operation signal may be a continuously sampled time domain signal.

In an embodiment, the sampling frequency is at least 50 Hz or at least 60 Hz.

In an embodiment, the output comprises a transmitter. In an embodiment, the output comprises a display.

In an embodiment, the location prior to the detected change and the location after the detected change are a fixed duration before and after the detected change.

A degradation state is a state of operation of the appliance or component of the appliance which deviates from normal operation.

In an embodiment, the appliance operation signal comprises information relating to the utility consumption of a domestic appliance.

In an embodiment, the utility consumption signal is an auditory signal and/or a vibratory signal.

In an embodiment, the appliance operation signal is a utility consumption signal.

The processor may be further configured to:

determine whether the probability that the appliance or the component of the appliance is in the or each of one or more degradation states is higher than a probability threshold value.

The processor may be further configured to:

determine whether the probability that the appliance or the component of the appliance is in the or each of one or more degradation states is increasing between detected changes for the appliance or the component of the appliance.

The output information relating to degradation of the appliance may be generated using one or more determined probabilities that the appliance or component of the appliance is in the or each of one or more degradation states.

According to another embodiment, there is provided an appliance operation signal processing method, comprising:

receiving information relating to an appliance operation signal, the appliance operation signal comprising information relating to operation of an appliance;

determining a probability that the appliance or a component of the appliance is in the or each of one or more degradation states, by applying a classifier to a feature vector comprising information relating to frequency data extracted from the appliance operation signal.

The method may further comprise:

monitoring an input appliance operation signal for a change in magnitude;

if a change is detected:

extracting a first section of the input signal, the first section being a section of the signal from a location prior to the detected change to a location after the detected change;

extracting a pre-event portion of the first section, the pre-event portion being at least a part of the first section of the signal prior to the change;

extracting a post-event portion of the first section, the post-event portion being at least a part of the first section of the signal after the change;

transforming each of the pre-event portion and the post-event portion into the frequency domain;

subtracting one of the frequency domain pre-event portion and the frequency domain post-event portion from the other of the frequency domain pre-event portion and the frequency domain post-event portion to give resultant frequency data;

wherein the frequency data extracted from the appliance operation signal is the resultant frequency data.

In an embodiment, the frequency data is a frequency spectrum.

According to another embodiment, there is provided an appliance operation signal processing method, comprising:

receiving an appliance operation signal, the appliance operation signal comprising information relating to operation of an appliance;

determining a probability that the appliance is in the or each of one or more degradation states, by applying a classifier to a feature vector comprising information relating to time domain data extracted from the appliance operation signal.

The method may further comprise:

monitoring an input appliance operation signal for a change in magnitude;

if a change is detected:

extracting a first section of the input signal, the first section being a section of the signal from a location prior to the detected change to a location after the detected change;

extracting a pre-event portion of the first section, the pre-event portion being at least a part of the first section of the signal prior to the change;

extracting a post-event portion of the first section, the post-event portion being at least a part of the first section of the signal after the change;

subtracting one of the pre-event portion and the post-event portion from the other of the pre-event portion and the post-event portion to give resultant time domain data;

wherein the time domain data extracted from the appliance operation signal is the resultant time domain data.

According to another embodiment, there may be provided a method of training a machine learning classifier to determine a probability that an appliance is in the or each of one or more degradation states, using a corpus of data comprising appliance operation signals comprising information relating to operation of an appliance and annotated with degradation states and normal operation states; the method comprising:

determining a probability that the appliance is in the or each of one or more degradation states, by applying the machine learning classifier to a feature vector comprising information relating to frequency data extracted from the appliance operation signal;

training the machine learning classifier using the annotations.

The method may further comprise:

monitoring an input appliance operation signal for a change in magnitude;

if a change is detected:

extracting an event section of the input signal, the event section comprising a section of the signal from a point prior to the change to a point after the change;

extracting a pre-event portion of the event section, the pre-event portion being a portion of the event section of the signal which is prior to the change;

extracting a post-event portion of the event section, the post-event portion being a portion of the event section of the signal which is after the change;

transforming each of the pre-event portion and the post-event portion into the frequency domain;

subtracting one of the frequency domain pre-event portion and the frequency domain post-event portion from the other of the frequency domain pre-event portion and the frequency domain post-event portion to give resultant frequency data;

wherein the frequency data extracted from the appliance operation signal is the resultant frequency data.

In an embodiment, the frequency data is a frequency spectrum.

According to another embodiment, there is provided a method of training a machine learning classifier to determine a probability that an appliance is in the or each of one or more degradation states, using a corpus of data comprising appliance operation signals comprising information relating to operation of an appliance and annotated with degradation states and normal operation states; the method comprising:

determining a probability that the appliance is in the or each of one or more degradation states, by applying the machine learning classifier to a feature vector comprising information relating to time domain data extracted from the appliance operation signal;

training the machine learning classifier using the annotations.

The method may further comprise:

monitoring an input appliance operation signal for a change in magnitude;

if a change is detected:

extracting an event section of the input signal, the event section comprising a section of the signal from a point prior to the change to a point after the change;

extracting a pre-event portion of the event section, the pre-event portion being a portion of the event section of the signal which is prior to the change;

extracting a post-event portion of the event section, the post-event portion being a portion of the event section of the signal which is after the change;

subtracting one of the pre-event portion and the post-event portion from the other of the pre-event portion and the post-event portion to give resultant time domain data;

wherein the time domain data extracted from the appliance operation signal is the resultant time domain data.

According to another embodiment, there is provided a carrier medium comprising computer readable code configured to cause a computer to perform the method.

In an embodiment, the system identifies elevated harmonics generated by an appliance and employs the use of Machine Learning based methods to determine whether the appliance has transitioned into a degradation state. The system may subsequently trigger a sequence of events to take the appliance back into its normal operation state, for example, the system may send a message that maintenance needs to be performed.

In an embodiment, the system may identify a degradation state based only on utility consumption data, e.g. power consumption data, and does not employ additional sensors such as temperature and vibration sensors. In an embodiment, the system identifies an appliance that has transitioned into a degradation state. A degradation state differs from a faulty state in that in a degradation state, the appliance is operational, whereas in a faulty state the appliance has failed and no longer operates. A degradation state is a state of operation of the appliance or component of the appliance which deviates from normal operation.

In an embodiment, the system and method are not limited to a specific appliance. In an embodiment, the method operates at least partly in the frequency domain.

In an embodiment, there is provided a method for monitoring domestic appliances for the detection and prediction of potential future failures.

In an embodiment, the system monitors individual appliance power consumption during normal operation, hereafter also referred to as a 'normal state', and reports any deviation from the normal state of the appliance, hereafter referred to as a 'degradation state'. This may trigger some form of preventative maintenance, without which would result failure of the appliance, hereafter referred to as the 'faulty state'.

In an embodiment, the system operates at various levels and conditions. By way of example only, the system may comprise a device that is directly connected to the appliance. Equally and by way of example only, the system may comprise a device that is connected to the main electricity supply of a house or other dwelling, which performs dis-aggregation of the appliance's electrical consumption from the overall dwelling's electricity consumption. An example of such a device is given in GB2475172A published on May 11, 2011 and incorporated herein by reference. In an embodiment, the system uses the dis-aggregated data to identify appliances in a degradation state.

In an embodiment, the method monitors the operational condition of appliances in a domestic or commercial environment through detailed analysis of their harmonics over the appliance's lifetime.

For example, the system may analyse the current and voltage being consumed by an appliance to infer whether the appliance performance is deteriorating. The current and voltage may be sampled by means of a current sensor and a voltage sensor. In an embodiment, the sensors read the real-time voltage and current at a sampling rate of up to 10 MHz. In an embodiment, the sensors read the real-time current and voltage at a sampling rate of greater than or equal to 50 Hz. In an embodiment, the sensors read the real-time current and voltage at a sampling rate of greater than or equal to 250 Hz. In an embodiment, the sensors read the real-time current and voltage at a sampling rate of greater than 1 kHz. In an embodiment, the sensors read the real-time current and voltage at a sampling rate of greater than 1 MHz.

The current and voltage sensors may be located at the electric source of the appliance (for example in the plug) or at the main electricity source of the dwelling for example. In the latter case, a pre-processing step of dis-aggregating the current and voltage portion pertaining to the appliance may be included, this portion in turn being supplied to the subsequent steps in the form of raw data at the data acquisition stage, and processed to determine whether the appliance is in a degradation state. The disaggregation can be performed by the same algorithm which classifies the degradation state for example. For example, the disaggregation may be performed by a first classifier using a first feature vector and a second classifier then classifies the degradation state using the same first feature vector.

In an embodiment, the method is for monitoring domestic appliances for the detection and prediction of potential future failures. In particular the method monitors individual appliance power consumption during normal operation, referred to as a 'normal state', and reports any deviation from the normal state of the appliance, referred to as a 'degradation state'. This may trigger some form of preventive maintenance which would otherwise result in the failure of the appliance, referred to as the 'faulty state'.

The system may comprise a device that is directly connected to the appliance or a device that is connected to the main electricity supply of a house or other dwelling, which performs dis-aggregation of the appliance's electrical consumption from the overall dwelling's electricity consumption, and uses the dis-aggregated data to identify appliances in a degradation state.

The method is a computer-implemented method. Since some methods in accordance with embodiments can be implemented by software, some embodiments encompass computer code provided to a general purpose computer on any suitable carrier medium. The carrier medium can comprise any storage medium such as a floppy disk, a CD ROM, a magnetic device or a programmable memory device, or any transient medium such as any signal e.g. an electrical, optical or microwave signal. The carrier medium may comprise a non-transitory computer readable storage medium.

FIG. 1 shows a schematic illustration of an appliance operation signal processing system 1, in accordance with an embodiment.

The system 1 comprises a processor 3 which takes an input appliance operation signal and outputs information relating to degradation of the appliance. A computer program 5 is stored in non-volatile memory. The non-volatile memory is accessed by the processor and the stored code is retrieved and executed by the processor 3. The storage 7 stores data that is used by the program 5.

The system 1 further comprises an input module 11 and an output module 13. The input module 11 is connected to an input 15 for receiving the appliance operation signal. The appliance operation signal may be an aggregate signal, comprising appliance operation data corresponding to two or more appliances. For example, the signal may correspond to all appliances in a building. Alternatively, the appliance operation signal may relate to a single appliance only. The input 15 may be a receiver for receiving data from an external storage medium or a network. Alternatively, the input 15 may comprise hardware for sampling the voltage and current consumption of a unit such as a building, for example as described in U.S. Pat. No. 9,250,101, or of an appliance connected to a smart plug for example. The input 15 may include an additional current input for one or more of a solar PV installation and/or a home battery storage unit. The input 15 may additionally or alternatively include hardware and sensors for sensing one or more of water consumption, gas consumption, auditory data, temperature data, humidity data or vibrations.

Connected to the output module 13 is output 17. The output 17 may be an interface that displays data to the user, for example a screen. Alternatively, the output may be a transmitter for transmitting data to an external storage medium or a network.

In an embodiment, the system 1 may be a metering or plug device located at the building. Alternatively, the system 1 may be a remote system 1, which receives data transmitted from the unit. For example, the system may be implemented on a cloud computing system, which receives data transmitted from a measuring device at the unit. Although in the described system, a single processor 3 located in a device is used, the system may comprise two or more processors configured to perform different parts of the processing. For example, the system may comprise a processor located on a local device which performs part of the processing (for example step detection), where the output data from the local device is transmitted to a remote processor (for example forming part of a cloud computing system) which performs the remaining part of the processing (for example the machine learning based classification).

In use, the system 1 receives data through data input 15. The program 5, executed on processor 3, outputs information relating to degradation of the appliance through the output 17 in the manner which will be described with reference to the following figures.

Figure 2:
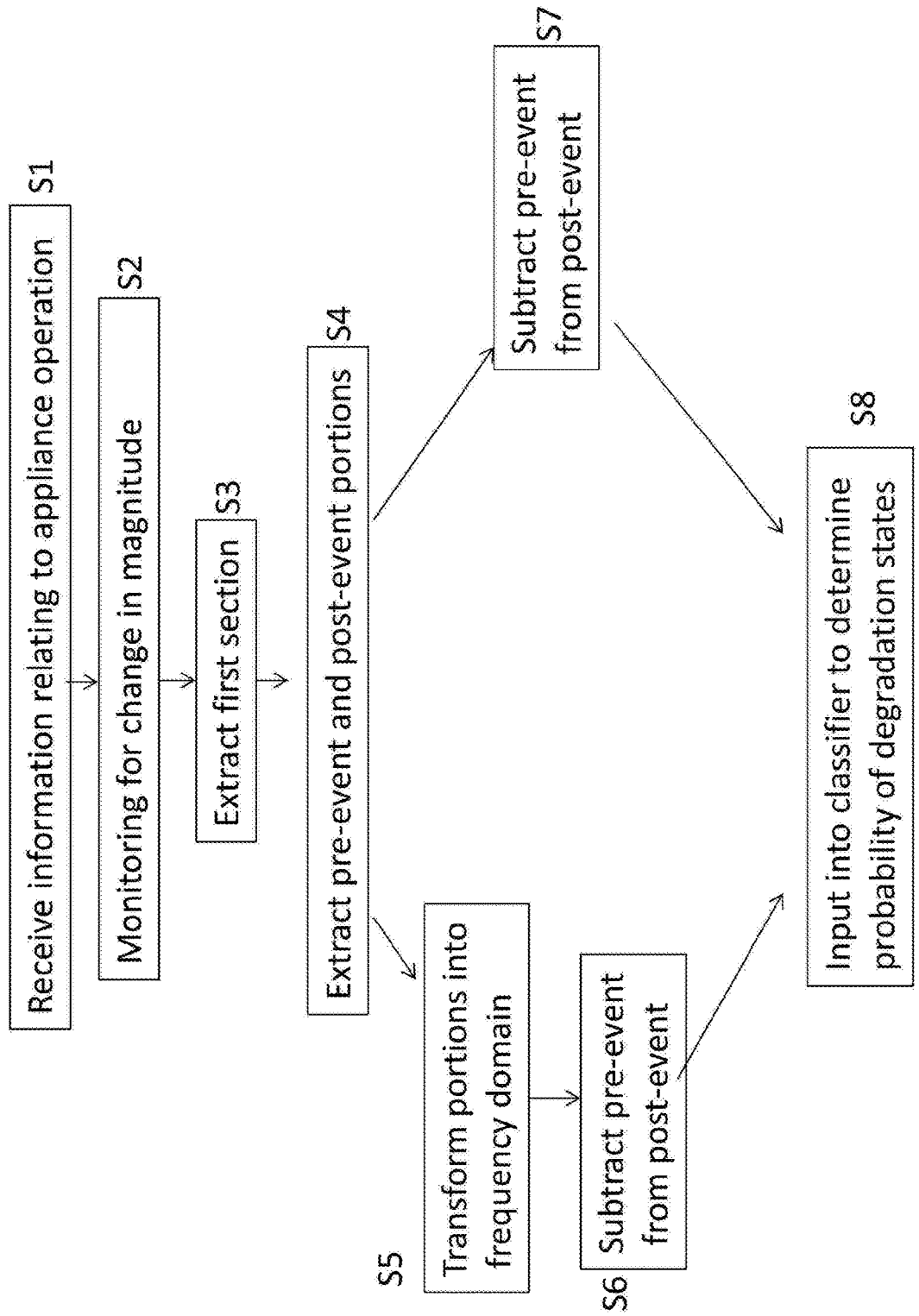
FIG. 2 shows a flow chart illustrating a method of processing an appliance operation signal in accordance with an embodiment.

FIG. 2 shows a flow chart illustrating an appliance operation signal processing method in accordance with an embodiment. The method will be described for the case where the appliance operation signal comprises an electrical signal, for example one or more current signals and/or voltage signals. However, alternatively or additionally the signal may comprise a water consumption, gas consumption, auditory data, temperature data, humidity data or vibratory data signal for example.

In step S1, information relating to an appliance operation signal is received. For example, an input current signal i(t) and an input voltage signal v(t) may be received. In an embodiment, sampling of the voltage and current is performed at a sampling frequency of greater than or equal to 50 Hz. In an embodiment, sampling of the voltage and current is performed at a sampling frequency of greater than or equal to 250 Hz. In an embodiment, sampling of the voltage and current is performed at a sampling frequency of greater than or equal to 1 kHz. In an embodiment, sampling of the voltage and current is performed at a sampling frequency of greater than or equal to 1 MHz.

The signal may be acquired by a collection apparatus located at the mains input of a building which measures an aggregate signal, such as that described in U.S. Pat. No. 9,250,101 or any other smart meter device. Alternatively, the signal may be acquired by a collection apparatus located on a single appliance, for example a smart plug device. Where the input signal corresponds to two or more appliances, an additional step of disaggregation may be performed.

The signal may comprise a single phase signal comprising a single current and voltage signal, a split phase (or dual phase) signal comprising two current signals and two voltage signals, or a three phase signal comprising three current signals and three voltage signals.

Further processing of the input current and voltage signals may be performed at this stage. For example, a power signal or a RMS current signal may be generated from the current and/or voltage signals. A power signal and/or RMS current signal may be used for step detection as described in the following step S2 for example. Real power may be calculated at the processor 9 from the current and voltage data, using windows corresponding to 1 or more mains cycles for example. In an embodiment, the real power may be calculated over a number of mains cycles, to improve the signal to noise ratio. In an embodiment, a real power value $P_l$ for a window l is calculated at the processor 9 using the expression:

$$P_l = \frac{1}{N}\sum_{n=1}^{N} v_n(t)i_n(t), t \in T_l$$

where N is the number of samples in each window l and $v_n(t)$ and $i_n(t)$ are the current and voltage values for the sample n of the voltage and current signals. For a 10 kHz read frequency in a country with 50 Hz main power, where the window corresponds to 1 mains cycle, N=200. RMS current may be calculated using windows of one or more mains cycles.

Step S2 comprises monitoring the appliance operation signal for a change in magnitude, i.e. an event. In this step, the signal is analysed to detect for step events, which correspond to changes in state of the appliance or components of the appliance. The term "state" is used here to refer to the different operation states of the appliance or components, for example "on" or "off", rather than to a degradation state.

Step S2 may comprise performing a simple step detection algorithm. The step detection may be performed using e.g. power or RMS current which is first derived from one or more of the input sampled current and voltage signals as described above. For example, changes in real power level or RMS current level that exceed a threshold may be detected. In an embodiment, the threshold is 10 Watts. In an embodiment, a change is detected by calculating the difference between adjacent samples. Where the signal comprises a split or three phase electrical signal, monitoring for a change in the magnitude of the input signal may comprise monitoring each, where a change detected in any of the signals is registered as a change.

Although the above description has related to detection of a change in a time domain signal (e.g. the real power or RMS current signal), alternatively or additionally, a determination of whether a change has occurred in the harmonics may be used.

If a change is detected, a first section of the input signal is extracted in S3, the first section being a section of the signal from a location prior to the detected change to a location after the detected change. Where the change is detected using a real power signal for example, the corresponding section of the sampled current signal and/or the sampled voltage signal may be extracted and stored. The section of the real power signal may additionally or alternatively be extracted and stored. The sections may be stored on a local device, or on remote storage, for example a cloud computing system. The location prior to the detected change and the location after the detected change may be a fixed duration before and after the detected change. Thus a section of fixed duration, for example 500 milliseconds either side of the detected change, may be extracted each time a change is detected.

In S4, a pre-event portion of the first section (the pre-event portion being at least a part of the first section of the signal prior to the change) and a post-event portion of the first section (the post-event portion being at least a part of the first section of the signal after the change) are extracted. These may be extracted from the real power signal, the current signal and/or the voltage signal for example. In an embodiment, only the portions of the sampled current signal are extracted.

Each of the pre-event portion and the post-event portion may be sections of fixed duration, extracted from the start and end of the first section. For example, a section of 0.2 seconds in duration may be extracted from the start and end of the first section.

In one embodiment, the pre-event portion and post-event portion may be identified by looking for periods of low variance, i.e. where the rolling variance remains below threshold value, in the signal for example. The pre-event portion may be identified by determining the location at which the rolling variance goes above a threshold value (i.e. the beginning of the magnitude change), and extracting a portion of fixed duration before this point. The post-event portion may be identified in a similar manner. The pre-event portion and the post-event portion may have the same duration, e.g. 0.2 seconds.

In step S5, each of the pre-event portion and the post-event portion are transformed into the frequency domain. The current signal and/or the voltage signal corresponding to each of the pre-event portion and the post-event portion may each have the form of a 1 dimensional array of $\{n_{samples}\}$ real numbers, where $n_{samples}$ is the number of sample points in the portions. A transform into the frequency domain (e.g. an FFT or FFT variant such as real FFT (RFFT)) is then applied to each array. This results in an array of $$\left\{\frac{n_{samples}}{2}\right\}$$

complex numbers for each of the current and voltage signals for each of the pre-event and post-event portions. Since the input data is real values, the output of the frequency transform is symmetric, and only one side need be kept.

The fundamental frequency of the current and voltage signals is the mains frequency (also referred to as the utility frequency or line frequency). This is the nominal frequency of the oscillations of the alternating current signal. In the UK this is 50 Hz, whereas in the US this is 60 Hz for example. The harmonics are sinusoidal components present in the frequency spectrum at frequencies that are integer multiples of the fundamental frequency. In the UK/Europe, where the fundamental frequency is 50 Hz, this will mean 50 Hz, 100 Hz, 150 Hz, 200 Hz . . . up to the Nyquist frequency, which is one half of the sampling frequency $$\left\{\frac{n_{samples}}{2}\right\}.$$

An array of the amplitude values for the one or more harmonic frequencies up to $$\left\{\frac{n_{samples}}{2}\right\}$$

for the current and/or voltage for each of the pre-event portion and post-event portion may be generated. The amplitude value for a particular frequency corresponds to the modulus of the complex number in the array entry corresponding to the frequency in the array output from the FFT of the current signal.

In an embodiment, the output arrays corresponding to the pre-event portion and the post-event portion are shortened, for example, only the entries corresponding to the first three harmonics (i.e. 50 Hz, 100 Hz and 150 Hz for a 50 Hz mains frequency) may be kept.

Step S6 comprises subtracting one of the frequency domain pre-event portion and the frequency domain post-event portion from the other of the frequency domain pre-event portion and the frequency domain post-event portion to give resultant frequency data. For example, if the event is a "switch-on" type event, the pre-event portion may be subtracted from the post-event portion, whereas if the event is a "switch-off" type event, the post-event portion may be subtracted from the pre-event portion. Alternatively, absolute values may be used.

Thus the array of pre-event current harmonic amplitude values (for example, the 50 Hz, 100 Hz and 150 Hz amplitude values for the current signal) may be subtracted from the array of post-event current harmonic amplitude values for example (or vice versa). Thus the peak values of one or more of the pre-event current harmonics may be subtracted from the peak values of the post event current harmonics for example (or vice versa). Step S6 outputs a feature vector comprising the resultant current harmonic amplitude values for one or more of the harmonics up to the Nyquist frequency (corresponding to information relating to the resultant frequency data).

In an embodiment, both current and voltage signals are used, and an FFT of both is used as part of the input feature vector.

Step S7 comprises subtracting one of the pre-event time domain portion and the post-event time domain portion from the other of the pre-event time domain portion and the post-event time domain portion to give a resultant time domain signal. For example, if the event is a "switch-on" type event, the pre-event portion may be subtracted from the post-event portion, whereas if the event is a "switch-off" type event, the post-event portion may be subtracted from the pre-event portion. Alternatively, absolute values may be used.

For example, the real power values corresponding to the pre-event portion calculated previously may be subtracted from the real power values corresponding to the post-event portion calculated previously (or vice versa). Alternatively, the sampled current values corresponding to the pre-event portion are subtracted from the sampled current values corresponding to the post-event portion (or vice versa). The resultant time domain data corresponds to the resultant current signal, i.e. the sample values corresponding to the 0.2 second duration of the post-event portion, with the pre-event portion values subtracted (or vice versa). Synchronisation of the mains cycles of the two signals are performed, such that the same parts of each cycle are subtracted. The calculations and manipulations performed on the raw signal are thus synchronised.

This step may be performed instead of or in addition to steps S5 and S6.

Where S7 is performed instead of S5 and S6, a feature vector comprising information relating to the resultant time domain data is output, for example a vector of the real power values or a vector of data extracted from the current sample values. The data extracted from the current sample values may comprise one or more of the maximum current value, the minimum current value, the inner fence, the 25th percentile, the median current value, the 75th percentile, the outer fence, the standard deviation, the skewness and the curtosis for example.

Where S5 and S6 are performed instead of S7, a feature vector comprising information relating to the resultant frequency data is output, for example, the feature vector may comprise the current harmonic amplitude values for the first three harmonics output from S6.

Where S7 is performed in addition to steps S5 and S6, the information relating to the time domain data is appended to the information relating to the frequency domain data to form a single feature vector. For example, the feature vector may comprise the current harmonic amplitude values for the first three harmonics output from S6 together with the values obtained from the current sample values (one or more of the maximum current value, the minimum current value, the inner fence, the 25th percentile, the median current value, the 75th percentile, the outer fence, the standard deviation, the skewness and the curtosis).

In step S8, the feature vector is inputted into a machine learning based classifier, which generates a probability that the appliance is in the or each of one or more degradation states. In an embodiment, further pre-processing may be performed on the feature vector before it is inputted into the classifier, thus a feature vector comprising information relating to the resultant time domain signal and/or information relating to the resultant frequency spectrum is generated from the outputs of S6 and/or S7. The further processing may include buffering, warping, stretching and/or normalisation for example.

Further information may be included in the input feature vector. For example, information relating to the duration of time between detected changes for the appliance may be extracted and included in the feature vector. For example, the feature vector corresponding to a detected change may further comprise an entry corresponding to the time since the last detected change.

Alternatively or additionally, where the appliance consumes water, the appliance operation signal may comprise a water consumption signal as well as the current and voltage signal. In this case, the feature vector may also comprise information determined from the water consumption signal relating to the amount of water contained in the appliance at the time of the detected change in magnitude of the electrical consumption signal.

The classifier may be a Hidden Markov Model based classifier for example. Alternatively, the classifier may be a neural network based classifier. Each output of the classifier may correspond to a different degradation state.

The classifier may thus output a probability value corresponding to each of a number of degradation states. The method may further comprise a step of determining whether any of these probabilities is higher than a probability threshold value. If one of the probabilities is higher than the probability threshold value, information indicating that the appliance is in the degradation state corresponding to the probability value is output. If two or more of the probabilities are higher than the probability threshold value, information indicating that the appliance is in the degradation state corresponding to the highest probability value above the threshold is output. If none of the probability values are higher than the threshold, then there may be no output, or an output indicating normal operation may be made for example.

Alternatively, the method may further comprise a step of determining whether the probability that the appliance or the component of the appliance is in the or each of one or more degradation states is increasing between detected changes. If it is determined to be increasing, information indicating that the appliance is in the degradation state having an increasing probability (or having the fastest increasing probability) for example over a fixed number of changes, is output.

The output information relating to degradation of the appliance is thus generated using one or more determined probabilities that the appliance or component of the appliance is in the or each of one or more degradation states.

The output information may be transmitted to a user, supplier or manufacturer for example. The output information may trigger a maintenance action to be performed on the appliance.

Although in the above described method, steps S2 to S7 are performed as pre-processing steps on the appliance operation signal, alternatively, one or more of these steps may be omitted. For example, the method may comprise receiving the appliance operation signal, for example a sampled current signal, and determining a probability that the appliance or a component of the appliance is in the or each of one or more degradation states by applying a classifier to a feature vector comprising information relating to frequency data extracted from a section of the appliance operation signal. Alternatively, the method may comprise receiving the appliance operation signal and determining a probability that the appliance is in the or each of one or more degradation states by applying a classifier to a feature vector comprising information relating to time domain data extracted from the appliance operation signal.

Figure 3:
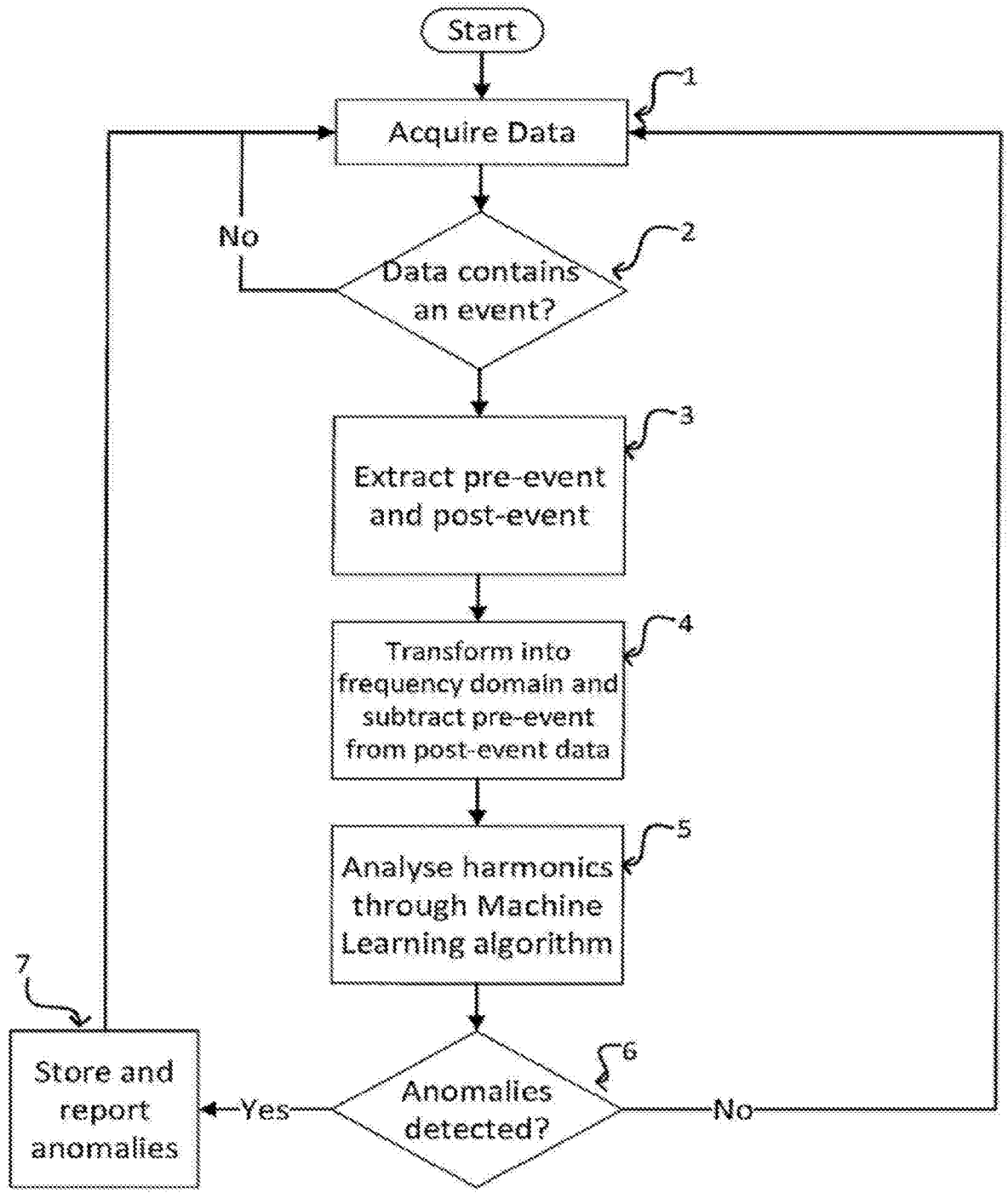
FIG. 3 is a flowchart of a method or algorithm for detecting and classifying potential appliance failures according to an embodiment.

FIG. 3 shows a flowchart of an algorithm that detects and classifies potential appliance failures in accordance with another embodiment. The first step of the method, "acquire data 1", acquires data, for example from current and voltage sensors, at periodic intervals i.e. the sampling frequency. The interval duration is dependent on the capabilities of the processor and system that the algorithm is deployed into. The data is crudely analysed in step 2 to determine whether further processing is required. The analysis may be a determination of whether a change has occurred in the power consumption of the appliance or its harmonics. This change is referred to as an 'event'. A simple step detection may be used to find abrupt changes in the utility signal, which are extracted as events. For example, a section of the signal is extracted, the section comprising the identified event, for example 500 milliseconds either side of the event.

In some cases, the abrupt change in power is a simple and effective indication of an event, however in other cases the change is more complex, such as, by way of example only, containing ramps, switchbacks, flat areas within the transition or an abrupt change in the phase angle between the current and the voltage, that is, an abrupt change in the real power consumption. Again, any changes above a threshold may trigger the event detection in these cases. These complex events may further: (i) be caused by single individual devices such as microwaves, dryers and washing machines whose state transitions are often complicated or (ii) be caused by more than one device happening to change state within the duration that the event was recorded.

In an effort to remove unwanted background noise, pre-event power levels and harmonics may be subtracted from the post event data in step 3. A portion of the extracted event section prior to the identified event may be extracted. This is the pre-event portion. A portion of the extracted event section after the identified event is also extracted. This is the post event portion. To achieve the subtraction, the pre-event current and voltage signal may be converted into the frequency domain using a Fast Fourier Transform (FFT) algorithm and the post event current and voltage signal may also be converted into the frequency domain using the same FFT, where the resultant peaks of the pre-event are subtracted from the post event peaks.

For example the pre-event portion of the current and voltage and the post-event portion of the current and voltage are inputted into an FTT algorithm, where the fundamental frequency is 50 Hz. The number of harmonics may be selected, where the maximum number of harmonics depends on the sampling frequency. The entire extracted event section may be transformed into the frequency domain in step 4 by means of a FFT algorithm, i.e. the pre-event and post-event portions. The resultant data is prepared to facilitate the Machine Learning algorithm (which is performed in step 5) input stage. For example, a feature vector comprising the amplitude values for each harmonic is generated. In this step, the data is used to populate the feature vector which is made up of a specific sequence of parameters.

The time domain pre-event portion (for example the real power signal or the sampled current signal) may be subtracted from the time domain post-event portion (the real power signal or sampled current signal) and the resulting values or information relating to the values also included in the feature vector. The information relating to the values may be one or more of a mean value, magnitude change, maximum value, minimum value, inner fence, 25th percentile, median value, 75th percentile, outer fence, standard deviation, skewness and curtosis. Alternatively, the feature vector may comprise the time domain data instead of the frequency data.

The method makes use of a Machine Learning algorithm, explained further in the following paragraphs, to identify characteristics of the appliance and infer its correct operation. If any deviations from normal operation are identified in step 6, information may be reported in step 7 to the host system.

The appliance is now determined to be in a degradation state and the information stored may contain the entire set of data that led to this conclusion. In instances where the variations are subtle, a number of subsequent identical conclusions may be necessary to classify the appliance as being in a degradation state.

The Machine Learning algorithm performed in step 5 can be, by way of example, a Hidden Markov Layer algorithm (HMM) or a Deep Neural Network algorithm or any other suitable learning algorithm that is able to perform classification.

Figure 4:
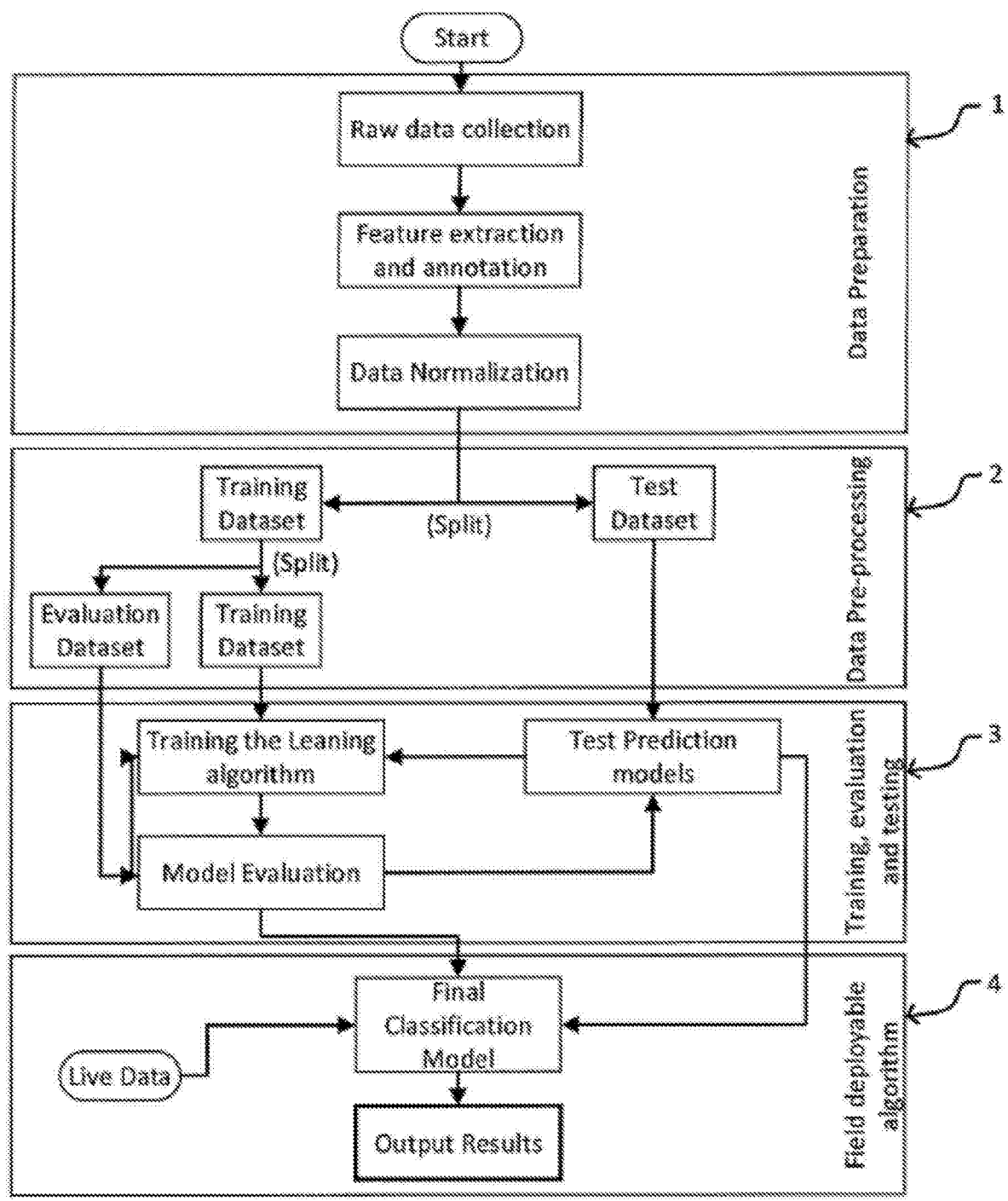
FIG. 4 is a flowchart of a method for training a machine learning algorithm to detect and classify potential appliance failures according to an embodiment.

FIG. 4 shows a flowchart for training the machine learning algorithm. The algorithm may be trained using real data. The real data may be collected through various means such as a Non-Intrusive Load Monitoring (NILM) device installed at the electricity cabinet of various homes and a number of appliances of the same models found in these homes installed in a lab, which is also equipped with a NILM device. The lab appliances are then modified to introduce components that induce the most common faults in the respective appliance.

Referring now to FIG. 4, during training, the data from the NILM devices is collected. It is then analysed to extract relevant features, i.e. the feature vectors are extracted in the same manner as discussed above in relation to operation stage. It is then annotated with normal operation states, fault identification (for example when the pump or drum motor or heater switch on or off and whether a fault is present at any of these states) and degradation states. It may then be normalized. All of these steps are performed in the Data Preparation stage 1. This stage involves extracting the feature vectors in the same manner as during operation, for example transforming the data into the frequency domain, so that the HMM or other machine learning algorithm is trained in one or both of the time and frequency domain.

The data is then split into a Training Dataset and a Test Dataset, where the former may be further split into the actual Training Dataset and an Evaluation Dataset. This is done in the pre-processing stage 2.

The algorithm is then trained, evaluated and tested in stage 3 through a number of iterations until the algorithm fits the required models.

The final classification algorithm is then presented with Live Data in a real world environment in step 4, to verify the results before being deployed, for example into NILM devices.

Where the system is to be used with an aggregate signal, the training data used will relate to multiple types of appliances. However, where the system is to be used for a single appliance, for example where it is to be installed in a smart plug, the training data may relate to the single type of appliance.

Example 1

By way of example only, the algorithm could be used for monitoring a washing machine or dishwasher to analyse its performance over time, either by analysing an aggregate signal or signals comprising data relating to the washing machine or dishwasher or by analysing a signal specific to the washing machine or dishwasher.

When, for example, the internal drain pipe works or filters start restricting water flow due to foreign debris getting trapped within the pipe works or filters, the draining duration of the appliance would progressively take longer until the point when the pipes or filters are completely blocked and the appliance never drains (fault state). Given the algorithm has built a history of the appliance's power cycles and patterns, the algorithm would be able to indicate that an anomaly has taken place and that the appliance may need servicing or its filters cleaned.

In further detail, during normal operation the water draining portion of the washing cycle may typically take no more than 2 seconds per litre of water. Typically, a washing machine may fill with 5 to 9 litres of water at any one time. Therefore, in this case the maximum time to drain all the water should not exceed 10 to 18 seconds depending on the model and state of the appliance (See FIG. 8 for a typical example). The benchmark time may be determined through historic feature set analysis and storage. If a blockage starts forming in the drain pipe, the drain cycle would take longer. By way of example, if a drain pipe restricted to a 2 mm opening, the drain cycle is extended to around a 100 seconds. When the drain pipe is completely blocked the drain cycle extends to 300 seconds before the washing machine stops working and displays an error warning.

Figure 5:
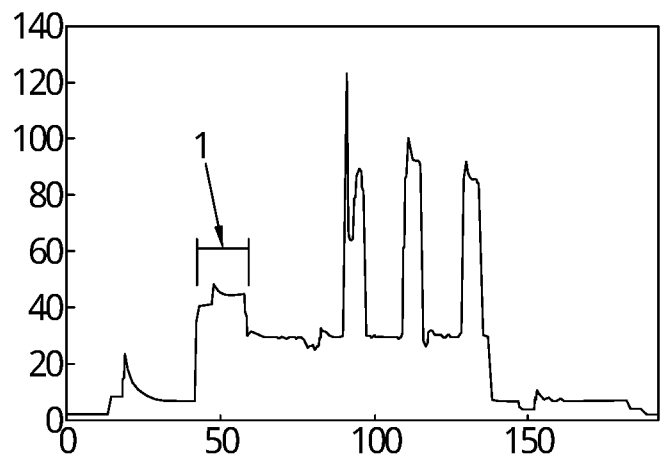
FIG. 5 is a visualization of a typical washing machine fault developing, where the top graph depicts normal operation, the middle graph depicts data of a washing machine drain pipe being restricted to a 2 mm opening (degradation state), while the bottom graph depicts the data from the same washing machine when the drain pipe is completely blocked (fault state)
Figure 5:
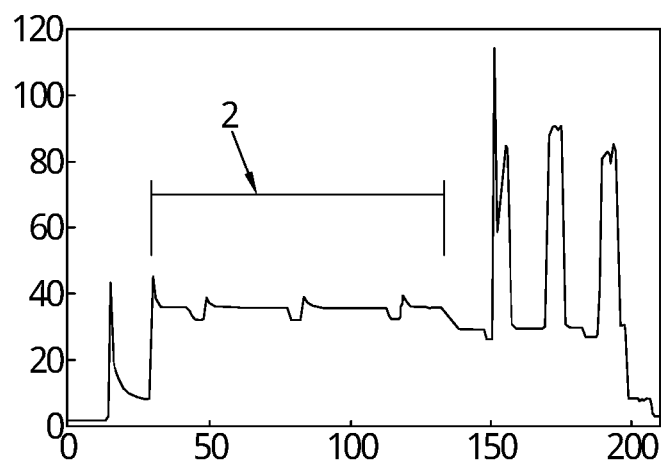
Figure 5:
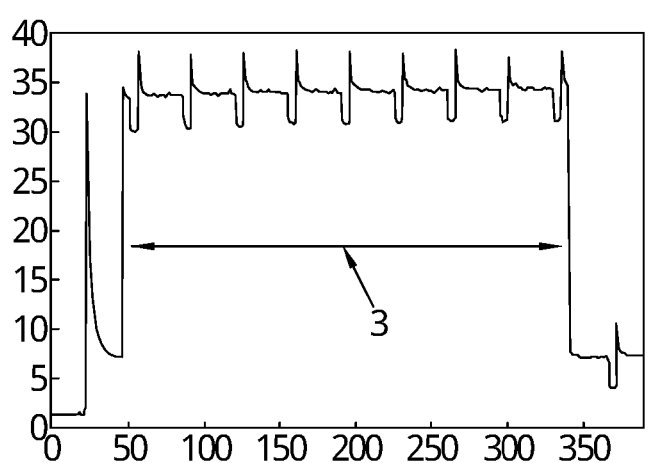

Example data for a washing machine fault developing is depicted in FIG. 5. FIG. 5 shows a visualization of a developing fault in a washing machine. Referring to FIG. 5, graph 1 encapsulates the drain portion of a washing machine cycle during normal operation and without any restrictions to the drain pipe works or filters. Graph 2 encapsulates the drain portion of a washing machine cycle with the drain pipe restricted to a 2 mm opening simulating the internal drain pipe works or filters starting to restrict due to foreign debris getting trapped within the said pipe works or filters. Graph 3 encapsulates the drain portion of a washing machine cycle when the drain pipe is completely blocked.

Thus a degradation state may be determined simply by comparing a current drain cycle duration to a benchmark or previous drain cycle duration. This method of determining whether a restriction is building within the pipe-works of the appliance and inferring that the appliance is now in a degradation state (through analysis of time domain information) functions reliably on most models tested, however, in some models these variations are subtle and a pump failure could still occur due to the stresses that the pump is exposed to.

Figure 6:
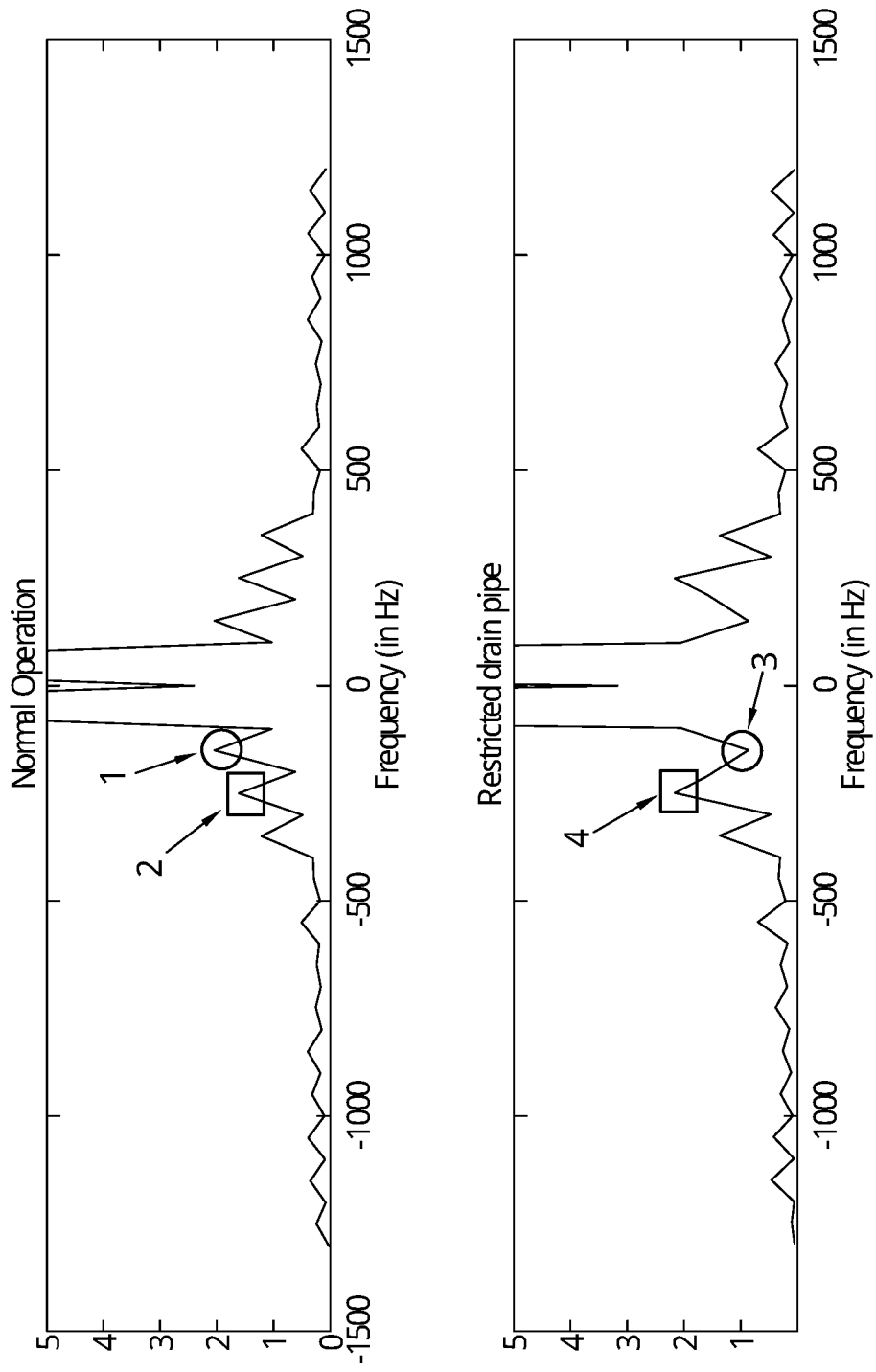
FIG. 6 shows plots, in the frequency domain, of harmonic changes exhibited when the drain pipe of a washing machine or dish washer motor restricts due to debris and scum build-up.

In an embodiment, the raw data is therefore also analysed in the frequency domain, where such a restriction in the drain pipe may manifest itself in a variation of the pump electric harmonics. FIG. 6 depicts a typical average harmonic variation over a number of electricity cycles that manifests itself when an appliance drain pump is restricted to 2 mm. The figure shows plots, in the frequency domain, of harmonic changes exhibited when the drain pipe of a washing machine or dish washer motor restricts due to debris and scum build-up. During normal pump operation with no restrictions, the 3rd harmonic (labelled 1) is always of greater magnitude than the 5th harmonic (labelled 2). As the drain pipe is gradually restricted, the 3rd harmonic magnitude gradually decreases while the 5th harmonic magnitude gradually increases. At a restriction of around 2 mm the 3rd harmonic magnitude (labelled 3) is much less than the 5th harmonic (labelled 4). Such features can be captured by the machine learning algorithm and allow more accurate classification of a degradation state. In this example, the feature vector also contains an entry relating to duration of drain event.

Using frequency domain data may therefore provide a reliable way of determining whether a restriction is building within the drain pipe works of the appliance and hence classify the appliance as being in a degradation state.

Example 2

Figure 7:
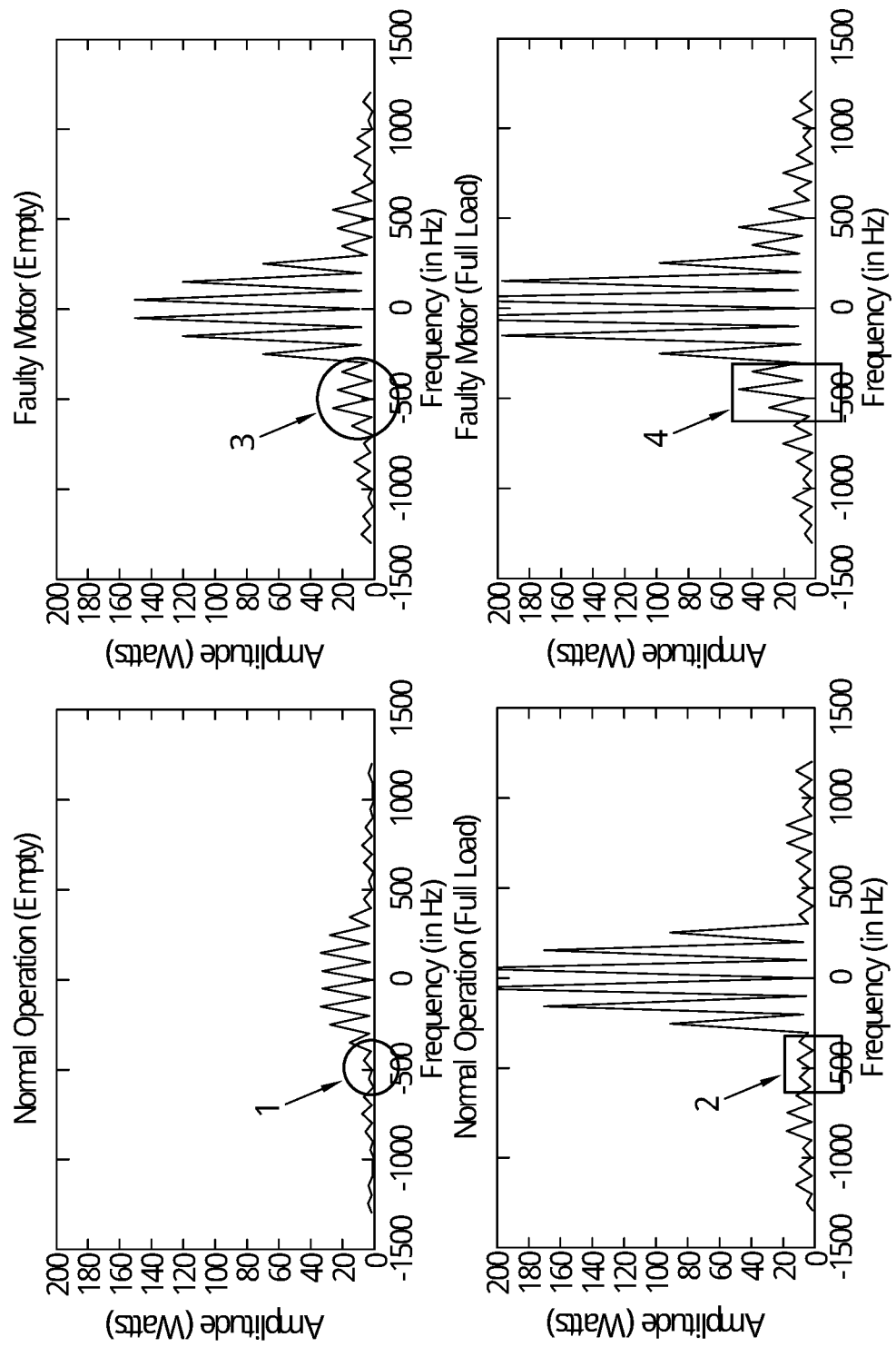
FIG. 7 shows plots, in the frequency domain, of harmonic changes exhibited when carbon brushes in a washing machine or tumble dryer motor deteriorate but are still operational.

By way of another example only, the algorithm could be used for monitoring a washing machine or a tumble dryer. Over time, it is expected that the motor rotating the drum experiences erosion of its carbon brushes. Eventually the carbon brushes would erode to a point where the contact with the armature is minimal and the motor fails. A reasonable number of uses before complete failure the motor exhibits a variation in the average harmonics over a number of electricity cycles as depicted in FIG. 7. FIG. 7 shows plots, in the frequency domain, of harmonic changes exhibited when carbon brushes in a washing machine or tumble dryer motor deteriorate but are still operational (degradation state).

During normal operation the 7th, 9th and 11th harmonics (FIG. 7, labelled 1 for an empty appliance and labelled 2 for a fully loaded appliance) are relatively low and of similar or lower magnitude than the 13th 15th and 17th harmonics. Before complete failure, the motor exhibits a dramatic change in its harmonics where the 7th, 9th and 11th harmonics (FIG. 5, labelled 3 for an empty appliance and labelled 4 for a fully loaded appliance) increase sharply as the carbon brushes continue to deteriorate. Such features can be captured by the machine learning algorithm and allow more accurate classification of a degradation state.

Using frequency domain data may therefore provide a method of determining that the drum motor is about to fail, and thus allow the appliance to be reliably classified as being in a degradation state.

Similar manifestations of harmonic changes before component failure has been observed in numerous domestic appliances such as but not limited to; boiler pumps, washing machines, tumble dryers, dish washer, fridges, freezers, electric heaters, air conditioners, fans, electric ovens, electric hobs, microwave ovens, toasters, kettles, coffee makers blenders and food processors, hair dryers, curlers and strainers, irons, power showers, etc. These changes are independent of any brand or model since most appliances operate in a similar manner. Furthermore, a well-trained machine learning algorithm may be able to detect electrical behavioural changes in both the time and frequency domain.

Example 3

In this example, the appliance operation signal processing system receives an appliance operation signal corresponding to an appliance comprising a water pump and a water pipe system. For example, the appliance operation signal processing system may be coupled only to the appliance or the water pump, and comprise a current sensor which samples only the current supplied to the water pump. Alternatively, the appliance operation signal processing system may be coupled to a mains input, and comprise a current sensor that samples the current supplied to a premises. A pre-processing step may be performed to disaggregate data relating to the water pump from the aggregate current signal.

In this example, the appliance operation signal thus comprises the sampled current supplied to a water pump. The water pump may be a component of an appliance such as a dishwasher or washing machine for example.

The system outputs information relating to degradation states of the appliance. For example, the degradation states may correspond to a plurality of blockage levels and cavitation (i.e. air in the system) in the pipe system.

The sampled current signal may be pre-processed in the manner described in relation to FIG. 2 above for example. Thus for example, an RMS current value corresponding to each mains cycle may be extracted. The RMS current signal may be monitored for a change in magnitude. When a change in magnitude is detected, e.g. corresponding to a switch on of the water pump, a first section of the original sampled current signal is then extracted, the first section being a section of the signal from a location prior to the detected change to a location after the detected change. A disaggregation step may be performed that identifies the change as corresponding to a switch on of the water pump where an aggregate signal is used.

A pre-event portion of the first section, the pre-event portion being at least a part of the first section of the signal prior to the change and a post-event portion of the first section, the post-event portion being at least a part of the first section of the signal after the change are then extracted. For example, the pre-event portion and the post-event portion may be 0.2 seconds in duration. The pre-event portion of the sampled current signal is subtracted from the post-event portion of the sampled current signal, to give resultant time domain data (or vice versa). Synchronisation of the mains cycles of the two sections signals may be performed, such that the same parts of each cycle are used during the subtraction.

Alternatively, one or more of the pre-processing steps may be omitted, and the time domain data may comprise a section of the original sampled current signal for example (i.e. without any event detection or subtraction steps).

Any pre-processing steps may be performed in the same manner during operation and during training. The procedure for training the classifier will now be described.

The training data may comprise data collected from a Non-Intrusive Load Monitoring (NILM) device installed at the electricity cabinet of various homes and a number of appliances of the same models found in these homes installed in a lab, which is also equipped with a NILM device. The lab appliances are then modified to correspond to the degradation states.

For example, various levels of blockages on the pipe system of the pump setup which correspond to changes in the current pattern drawn by the pump are induced for the lab devices. A valve comprising a handle fitted to a pipe is used to induce blockages. The handle can be turned up to an angle of 90 degrees, which corresponds to a complete blockage of the pipe (where a zero degree turn corresponds to no blockage). In addition, the setup may comprise an air valve, which can be opened to introduce air into the pipes.

The states that are considered in this example are thus as follows:
1) 0 degree blockage (e.g. no blockage of pipe, normal state);
2) 15 degree blockage;
3) 30 degree blockage;
4) 45 degree blockage (e.g. half blockage of pipe);
5) 60 degree blockage;
6) 75 degree blockage;
7) 90 degree blockage (e.g. full blockage of pipe);
8) Cavitation (e.g. air in the pipe system).

States 2 to 6 correspond to degradation states. State 1 is the normal state. States 7 and 8 are fault states.

Figure 9:
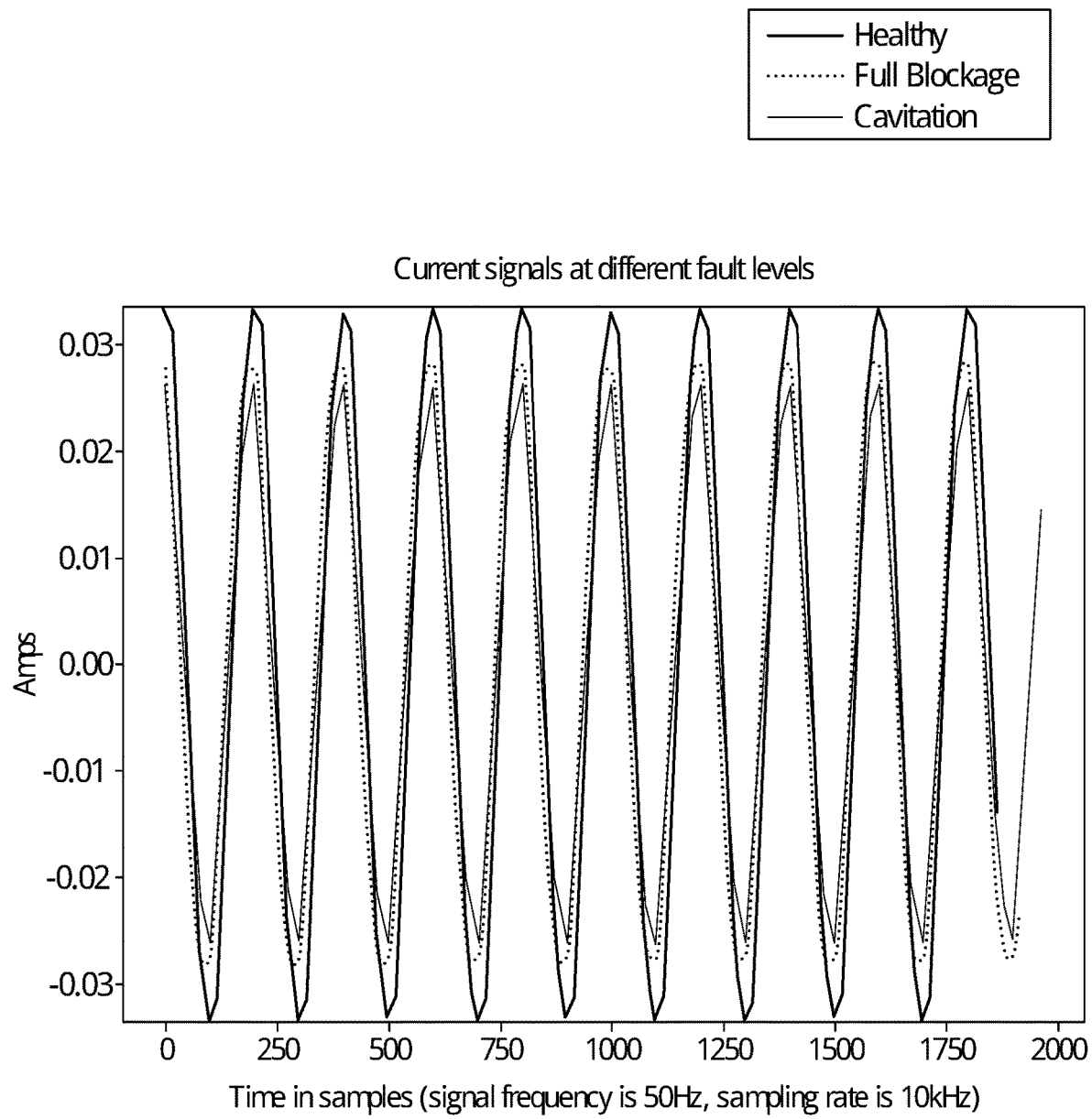
FIG. 9 shows a graph of sampled current signals for a water pump for three different states of the appliance pipe system.

The electrical current drawn by the water pump is sampled for many examples of all the states described above. FIG. 9 shows a graph of sampled current signals for state 1 (no blockage), state 7 (full blockage), and state 8 (cavitation).

A training data set, comprising many sampled current signals for each state is therefore generated in the lab. The pre-processing steps described above may optionally be performed on the generated data in order to extract and generate the sampled current signals, for example so that each sampled current signal corresponds to an event, and where the pre-event signal has been removed. Resultant time domain data, corresponding to the 0.2 second portions of resultant sampled current signals are therefore generated. These correspond to the resultant time domain data for multiple training examples. Alternatively, 0.2 second portions of the raw sampled current data may be used.

For each signal, a probability that the appliance is in each of the states is determined, by applying a classifier to a feature vector comprising information relating to the time domain data.

In this case, the feature vector comprises one or more of the following: minimum value, inner fence value, 25th percentile, median value, 75th percentile, outer fence, maximum value, standard deviation, skewness, curtosis. A feature extraction process is performed to extract these features from the time domain data for each signal.

An example process of extracting these features from the time domain data will now be described. The AC current signal has a fundamental frequency corresponding to the mains frequency, in this example 50 Hz (or thereabouts). Each 0.2 second current signal can therefore be segmented into multiple single waves. Each wave is defined as all points from one peak to another. First the signal is split into individual waves. The maximum amplitude value of each wave is extracted, and the absolute value of the trough of each wave is extracted. If each current data signal is 0.2 seconds in duration, and the mains frequency is 50 Hz, 10 peaks and 10 troughs are extracted from each 0.2 second duration current signal, giving a total of 20 extrema points. Utilizing these extrema that are extracted from the time domain data corresponding to the different states, one or more of the following time-domain features may be extracted and used to train the machine learning algorithm:
1) Minimum value;
2) Inner fence;
3) 25th percentile;
4) Median value;
5) 75th percentile;
6) Outer fence;
7) Maximum value;
8) Standard deviation;
9) Skewness;
10) Curtosis.

Thus the feature vector comprising information relating to the time domain data comprises one or more of the above values, extracted from the sampled current signal of 0.2 second duration.

Figure 10:
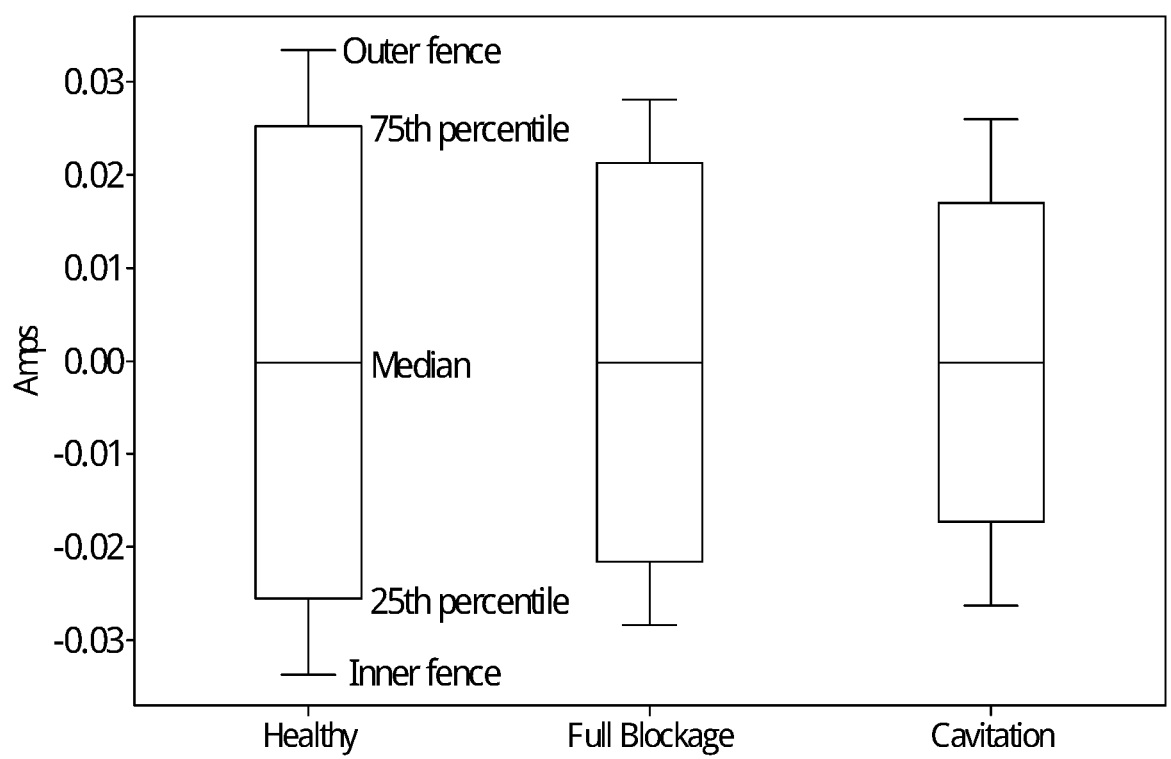
FIG. 10 shows a graph of boxplots indicating average values of features for three different states of the appliance pipe system.

FIG. 10 shows a graph that contains boxplots that indicate the values of the inner fence, 25th percentile, median value, 75th percentile and outer fence for no blockage (normal state), full blockage (fault state), and cavitation (degradation state), to illustrate the difference in these features for different states. Each boxplot was calculated using a minute long current signal. It is clearly seen from the boxplots features that different states take different values, thus different states can be identified by using these features to train a machine learning algorithm.

As discussed previously, the machine learning algorithm can also make use of frequency-domain features. The above describes extraction of features from time domain data. Alternatively or additionally however, frequency domain data may be used to extract the features. In this case, each of the pre-event portion and the post-event portion of the sample current may be transformed into the frequency domain, and the frequency domain pre-event portion subtracted from the frequency domain post-event portion to give resultant frequency data, as has been described in relation to FIG. 2 above. Alternatively, one or more of these pre-processing steps may be omitted, and the frequency domain data may comprise a section of the original sampled current signal for example (i.e. without any event detection or subtraction steps) transformed into the frequency domain.

The feature vector thus additionally or alternatively comprises information relating to the frequency data. The described example relates to the case where the frequency data is extracted in addition to the time domain features described above.

Figure 11A:
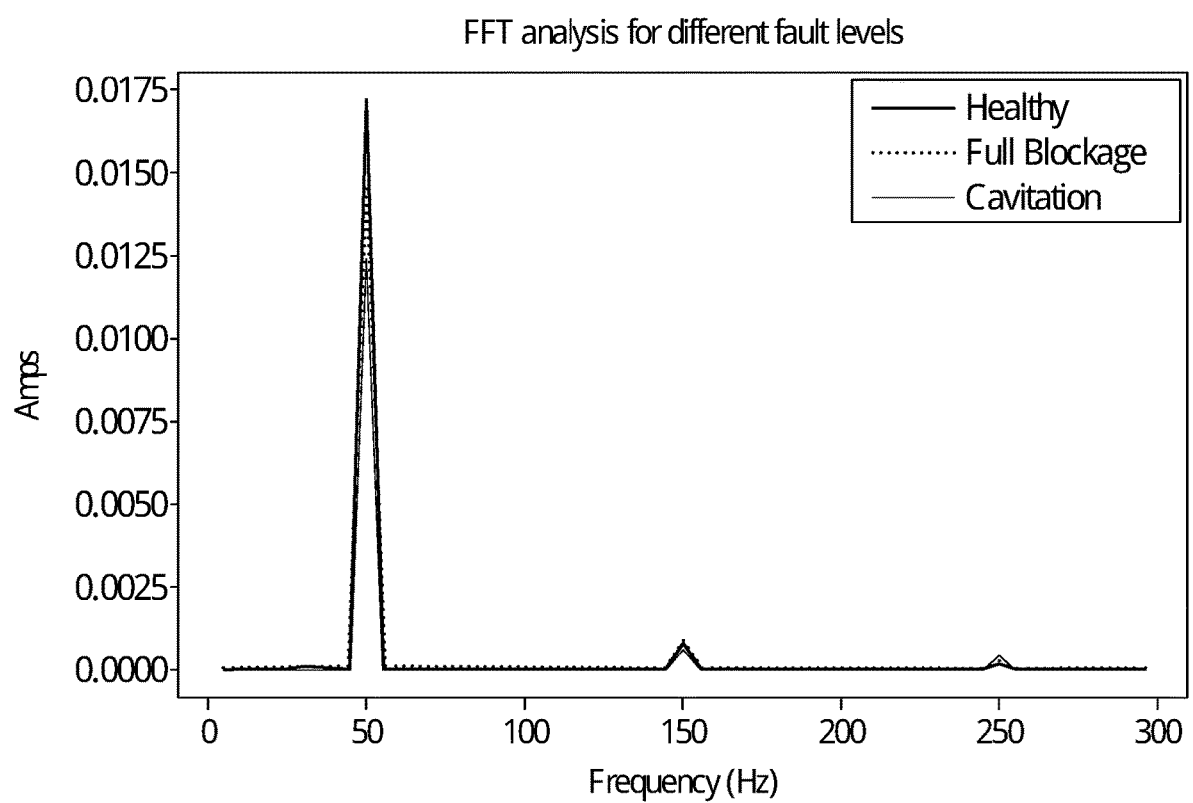
FIGS. 11(a), (b) and (c) show graphs of the first three harmonic components extracted from the sampled current signals for a water pump for three different states of the appliance pipe system.
Figure 11B:
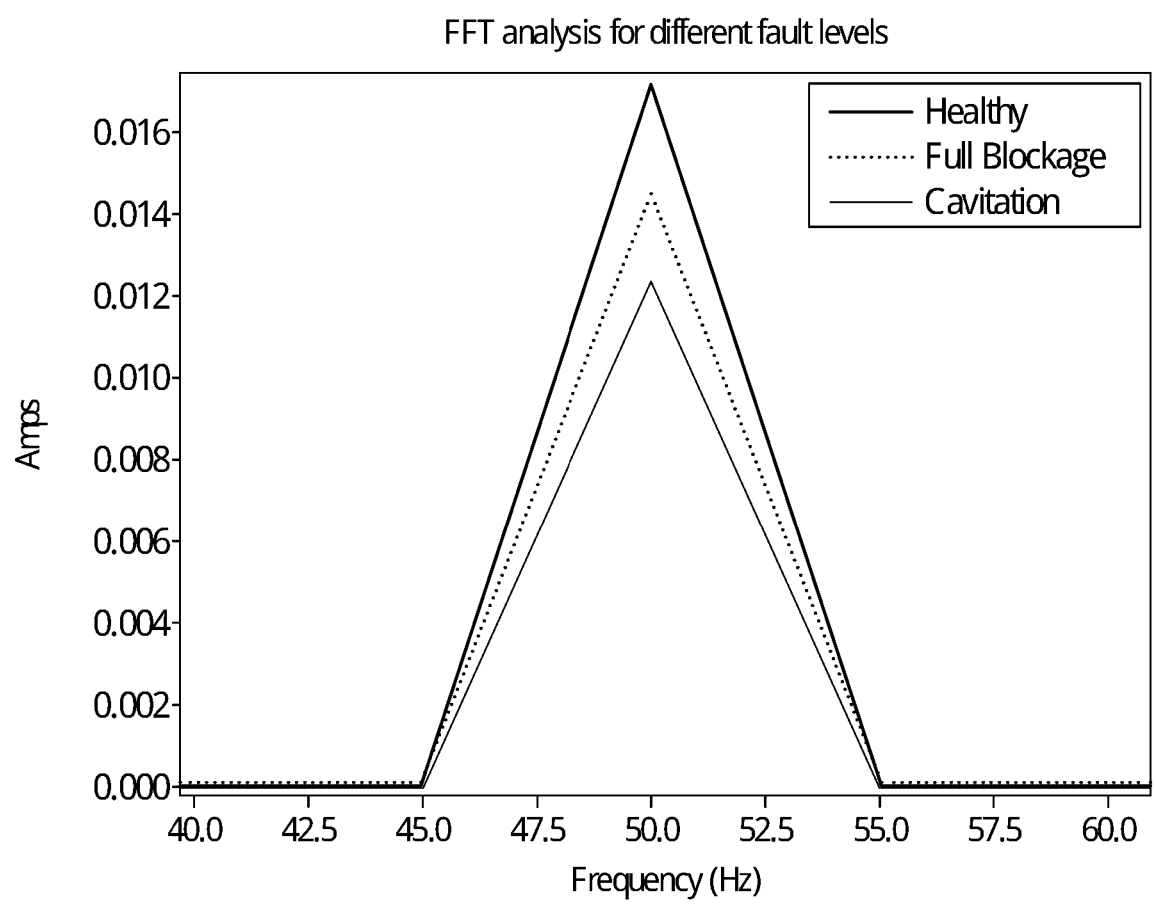
Figure 11C:
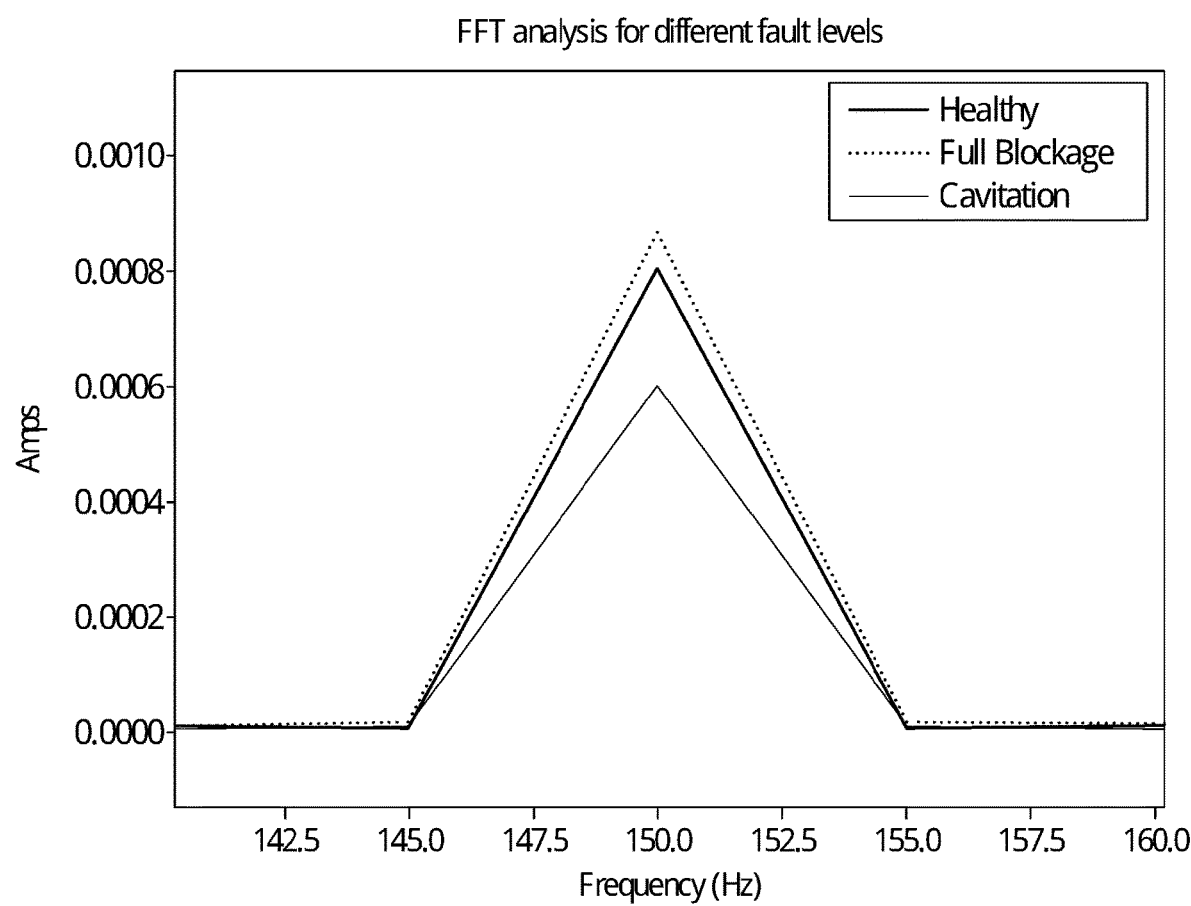

In order to extract frequency domain features, the FFT of the current signals is calculated, for example as described in relation to FIG. 2. The current intervals may be 0.2 second intervals for example. From the FFT output, the amplitudes of the first, second and the third harmonics of the signal (i.e. 50 Hz, 100 Hz and 150 Hz for a 50 Hz signal) may be extracted as the features to be included in the feature vector. FIG. 11(a) is a graph that shows the amplitude of the first, second and third harmonics calculated from 0.2 second intervals of data for the normal state (no blockage), fault state (full blockage), and degradation state (cavitation). FIGS. 11(b) and (c) show zoomed in views of the graph in FIG. 11(a) to show the distinction in amplitudes at 50 Hz and 150 Hz.

Thus in this example, a feature vector comprising the 10 time domain features (features 1 to 11 listed above) and three frequency domain features (the amplitude of the first, second and third harmonic) are generated for each 0.2 second duration current signal extracted for a detected event.

Training of the supervised machine learning algorithm is performed using the feature vectors extracted from the training data set. First, the feature vectors are each labelled according to the state that they were calculated from (for example with a vector of the probability values corresponding to each state, being 1 for the state the appliance was in and 0 for the other states). Then, a neural network is trained on this labelled data, where the neural network learns to predict the probability values for each state with minimal error. In particular, the extracted features vectors are fed into the neural network. The neural network is defined such that it outputs probabilities for each state (e.g. the normal state, fault state and degradation states) defined in the training data.

The training process may comprise the steps of:
1. Feeding in features to the neural network;
2. The neural network outputs probabilities for each state;
3. Calculating the error between the prediction and the truth label associated with the signal which the features were extracted from;
4. Back-propagating the error and updating the neural network parameters accordingly.

Figure 12:
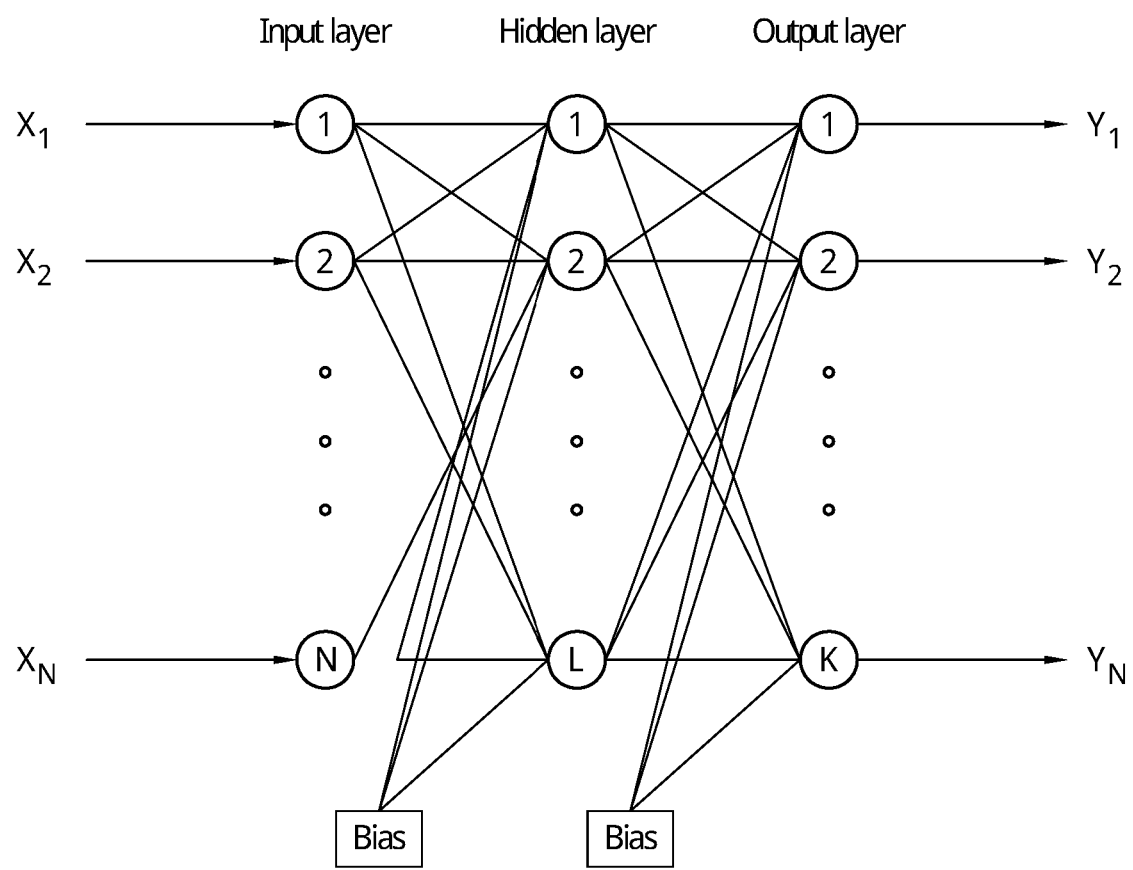
FIG. 12 shows a schematic illustration of an example classifier architecture which may be used in accordance with an embodiment.

FIG. 12 shows an example neural network architecture which may be used in accordance with an embodiment. The neural network in this example comprises three layers: an input layer, a hidden layer and an output layer. However, in general the neural network may comprise more than one hidden layers.

The input layer comprises a node corresponding to each feature in the input feature vector. For example, if the input feature vector comprises the 10 time domain features discussed above, there are 10 input nodes (i.e. N=10). If the input feature vector comprises the 3 frequency domain features discussed above there are 3 input nodes.

In this example, the hidden layer is a fully connected layer, comprising 32 nodes and 1 bias node (i.e. L=32).

In this example, the output layer comprises 8 nodes, each corresponding to a state (i.e. the 5 degradation states, the normal state and the 2 fault states discussed above), and a bias node.

During feed forward operation, each feature in the feature vector is input into the corresponding input node. The output of each layer is then fed as the input to the subsequent layer. Each node in the hidden layer computes a weighted sum of all of its inputs (being the outputs of each input node) using a weight vector, and an additive bias term, and then applies an activation function to the result. For example, for the hidden layer, a ReLU activation function may be used. Each node in the output layer computes a weighted sum of all of its inputs (being the outputs of each hidden layer node) using a weight vector, and an additive bias term. The outputs of the output layer may be passed through a further layer, for example they may be passed through a softmax function, which maps the values of each output node to the range [0, 1] while preserving the relative distances between the values and ensuring that the sum of all nodes add up to 1. The output of the neural network is thus a vector comprising a probability corresponding to each state.

During training, the weights may be initialized from a truncated normal distribution. The bias values may be initialised to zero or small positive numbers for example. The weights and biases which characterise each layer are then updated during the training.

During the training process, the neural network is run in the feed forward mode using the weights and biases and inputting the training examples. The network may be trained using a cross-entropy loss function with the momentum optimization function, with a decaying learning rate for example. A loss function represents a measure of the compatibility between the prediction (i.e. the probability values generated by the neural network) and the ground truth label. The optimizer function is used to update the weights and biases.

For each training example, the neural network outputs the probability value for each state. A back propagation algorithm is then performed to update the weights and bias variables. The gradient of the loss with respect to each of the parameters (i.e. weights and biases) in the neural network is determined, based on the back-propagated error signal and the feedforward activation signals (inputs to each layer). Every operation performed in the forward pass is differentiable, therefore a functional expression for the derivative of the loss with respect to every single weight/bias can be determined by virtue of the chain rule. The gradient values are calculated from these expressions using the back-propagated error and the activations (inputs) for each layer from the forward pass (cached during the forward pass). This results in an array of gradient values, each corresponding to a weight or bias, corresponding to each training example. These are converted to a single gradient value for each weight and bias (for example by taking the average of the gradient values for all training examples for the particular weight/bias).

The gradient for each weight and bias is then used to calculate the updated layer weight and bias variables from the previous values using the optimizer function (i.e. a gradient descent type optimiser). The input to the optimiser function for each weight/bias value is the previous weight/bias value, the gradient corresponding to the weight/bias value and a learning rate parameter. In general, gradient descent based optimizers update the weight in the direction of steepest descent of the loss function (w.r.t. the weight) scaled by a learning rate parameter $\eta$.

The weight and bias variables in the neural network are then replaced with the new values. This may be performed iteratively, using batches of the training data, until convergence of the error is reached, or sufficient time is deemed to have passed.

During operation, the neural network is simply run in the feed forward manner, where extracted feature vectors are fed into the input layer in the same manner as during training, and the neural network outputs the probability value corresponding to each state. The same feature vectors used during training are also used during testing and operation. Thus if the algorithm is trained using time-domain features, it should be tested and implemented using time-domain features as well, and the same applies to frequency-domain features.

Thus during operation, the following steps may be performed:
1. The current drawn by the water pump is sampled;
2. Pre-processing of the current as described above may be performed, and the feature vectors are extracted from e.g. 0.2 second long current samples (being pre-processed or simply extracted);
3. The extracted feature vector is passed through the trained neural network, and the network outputs its confidence levels for different kinds of faults associated with the feature vector, i.e. probability values for each state.

Although the above described systems and methods use input electrical consumption data, they may equally be used with other forms of utilities such as water and gas (either alternatively or additionally to electrical power), where the flow harmonics are analysed in a similar fashion to deduce potential failure of an appliance.

Figure 8:
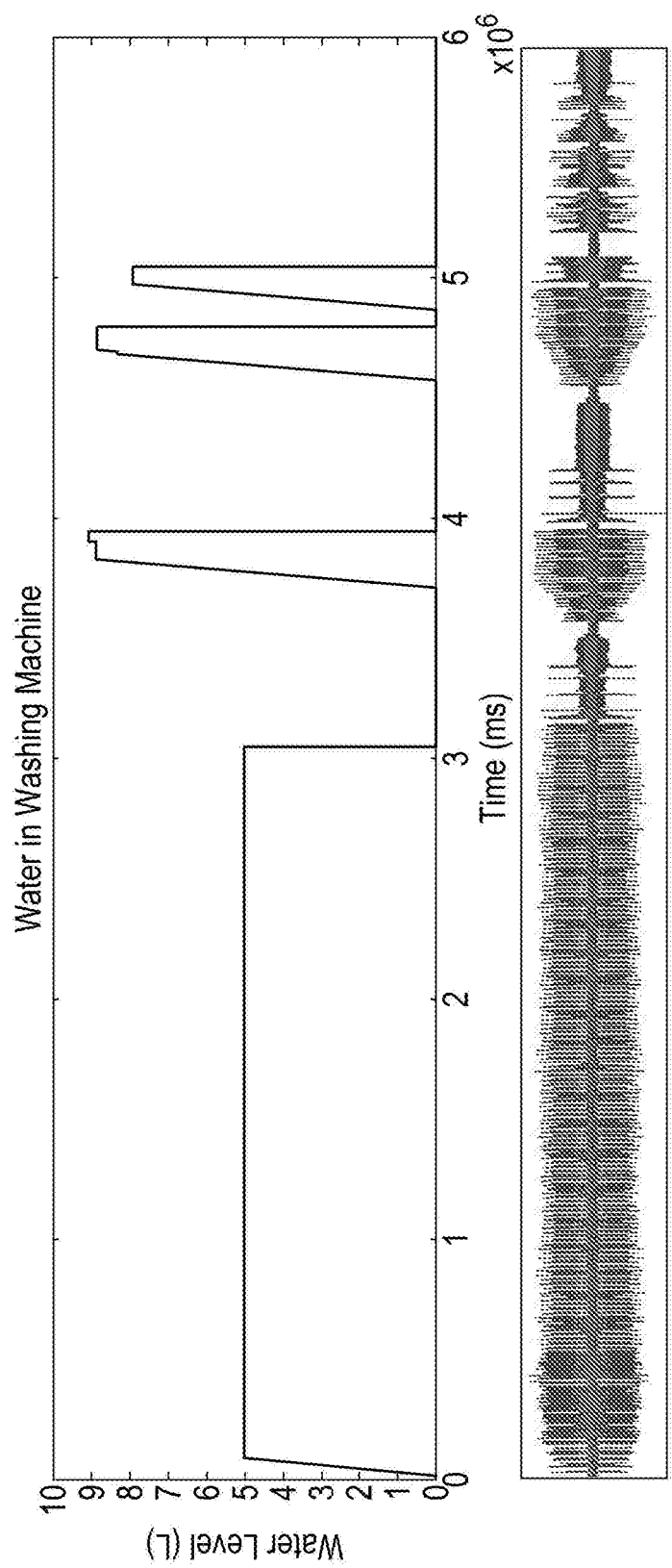
FIG. 8 shows a plot of the level of water in a washing machine compared to the current consumption of the same machine, where water level is measured using a flow meter attached to the main water supply of the dwelling where the washing machine is located, and disaggregated from other appliances.

By way of example only, FIG. 8 depicts the level of water in a washing machine compared to the electrical current consumption of the same machine. The water level monitoring may be used on various appliances that consume water. Water level may be measured using a flow meter attached to the main water supply of the dwelling where the appliance is located and disaggregated from other appliances for example. The water level data is used to deduce amount of water within the appliance and may therefore be used to determine the exact amount of time required to drain the water from the machine. Any extension of this time is assumed to be a potential blockage in the drain pipe works of the machine. In addition, historical data of the flow rate may be maintained to identify any anomalies in the machine's water filling mechanism. Thus an additional feature relating to the time required to drain the water from the machine may be included in the feature vector.

Similarly, the system may be extended to the analysis of auditory, gas, temperature, humidity and other sensors that may be analysed in a similar manner. Features extracted from the data measured by these sensors may be included in the extracted feature vector.

Finally, the status of the appliance (i.e. information relating to whether the appliance is in a degradation state) may be communicated through transmitters, whether hard-wired or wireless, of the device hosting the deployed algorithm in order to communicate the appliance condition to the user and/or other systems, store the information and appliance state and/or alert the user and/or other systems that the appliance has changed its state together with the nature of the state change. The communication, storage and alerting may be performed via direct communication to a users phone and/or computer and/or through a third provider and/or system.

Further embodiments are set out in the following clauses:

1. An appliance operation signal processing system comprising:
an input for receiving an appliance operation signal, the appliance operation signal comprising information relating to operation of an appliance;
an output for outputting information relating to degradation of the appliance; and
a processor configured to:
monitor an input appliance operation signal for a change in magnitude;
if a change is detected:
extract a first section of the input signal, the first section being a section of the signal from a location prior to the detected change to a location after the detected change;
extract a pre-event portion of the first section, the pre-event portion being at least a part of the first section of the signal prior to the change;
extract a post-event portion of the first section, the post-event portion being at least a part of the first section of the signal after the change;
transform each of the pre-event portion and the post-event portion into the frequency domain;
subtract the frequency domain pre-event portion from the frequency domain post-event portion to give a resultant frequency spectrum;
determine a probability that the appliance or a component of the appliance is in the or each of one or more degradation states, by applying a classifier to a feature vector comprising information relating to the resultant frequency spectrum.

2. The system according to clause 1, wherein transforming each of the pre-event portion and the post-event portion into the frequency domain comprises using a fast Fourier transform.

3. The system according to clause 1 or 2, wherein the information relating to the resultant frequency spectrum comprises the amplitude value corresponding to each harmonic frequency.

4. The system according to clause 3, wherein the appliance operation signal is an electrical power signal and the fundamental frequency is 50 Hz or 60 Hz.

5. The system according to any preceding clause, wherein the processor is further configured to:
subtract the time domain pre-event portion from the time domain post-event portion to give a resultant time domain signal, wherein the feature vector further comprises information relating to the resultant time domain signal.

6. A appliance operation signal processing system comprising:
an input for receiving a appliance operation signal, the appliance operation signal comprising information relating to operation of an appliance;
an output for outputting information relating to degradation of the appliance; and
a processor configured to:
monitor an input appliance operation signal for a change in magnitude;
if a change is detected:
extract a first section of the input signal, the first section being a section of the signal from a location prior to the detected change to a location after the detected change;
extract a pre-event portion of the first section, the pre-event portion being at least a part of the first section of the signal prior to the change;
extract a post-event portion of the first section, the post-event portion being at least a part of the first section of the signal after the change;
subtract the pre-event portion from the post-event portion to give a resultant time domain signal;
determine a probability that the appliance is in the or each of one or more degradation states, by applying a classifier to a feature vector comprising information relating to the resultant time domain signal.

7. The system according to clause 6, wherein the processor is further configured to:
transform each of the pre-event portion and the post-event portion into the frequency domain;
subtract the frequency domain pre-event portion from the frequency domain post-event portion to give a resultant frequency spectrum, wherein the feature vector further comprises information relating to the resultant frequency spectrum.

8. The system according to any preceding clause, wherein monitoring the input appliance operation signal for a change in magnitude comprises monitoring for a change in magnitude greater than a change threshold value.

9. The system according to any preceding clause, wherein the processor is further configured to extract information relating to the duration of time between detected changes for the appliance, wherein the feature vector further comprises the extracted information relating to the duration of time between events.

10. The system according to any preceding clause, wherein the appliance consumes electrical power, and wherein the appliance operation signal is an electrical current signal and/or an electrical voltage signal and/or an electrical power signal.

11. The system according to any preceding clause, wherein the appliance consumes water and the appliance operation signal comprises a water consumption signal.

12. The system according to clause 11 when dependent on clause 10, wherein the processor is further configured to, if a change is detected in the electrical current signal or the electrical voltage signal, determine, from the water consumption signal, the amount of water contained in the appliance at the time of the change, wherein the feature vector further comprises information relating to amount of water contained in the appliance.

13. The system according to any preceding clause, wherein the appliance consumes gas and wherein the appliance operation signal comprises a gas consumption signal.

14. The system according to any preceding clause, wherein the classifier is a machine learning classifier.

15. The system according to any preceding clause, wherein the appliance operation signal comprises information relating to utility consumption of a plurality of appliances and wherein the processor is further configured to identify the appliance corresponding to the detected event.

16. The system according clause 15, wherein the classifier is further configured to determine a probability that the detected event corresponds to the or each of one or more appliances.

17. The system according to any preceding clause, wherein the appliance operation signal is a continuously sampled time domain signal.

18. The system according to clause 17, wherein the sampling frequency is at least 50 Hz or at least 60 Hz.

19. The system according to any preceding clause, wherein the output comprises a transmitter.

20. The system according to any preceding clause, wherein the output comprises a display.

21. The system according to any preceding clause, wherein the location prior to the detected change and the location after the detected change are a fixed duration before and after the detected change.

22. The system according to any preceding clause, wherein a degradation state is a state of operation of the appliance or component of the appliance which deviates from normal operation.

23. The system according to any preceding clause, wherein the appliance operation signal comprises information relating to the utility consumption of a domestic appliance.

24. The system according to any preceding clause, wherein the utility consumption signal is an auditory signal and/or a vibratory signal.

25. The system according to any of clauses 1 to 23, wherein the appliance operation signal is a utility consumption signal.

26. The system according to any preceding clause, wherein the processor is further configured to:
determine whether the probability that the appliance or the component of the appliance is in the or each of one or more degradation states is higher than a probability threshold value.

27. The system according to any preceding clause, wherein the processor is further configured to:
determine whether the probability that the appliance or the component of the appliance is in the or each of one or more degradation states is increasing between detected changes for the appliance or the component of the appliance.

28. The system according to any preceding clause, wherein the output information relating to degradation of the appliance is generated using one or more determined probabilities that the appliance or component of the appliance is in the or each of one or more degradation states.

29. An appliance operation signal processing method, comprising:
receiving information relating to an appliance operation signal, the appliance operation signal comprising information relating to operation of an appliance;
monitoring an input appliance operation signal for a change in magnitude;
if a change is detected:
extracting a first section of the input signal, the first section being a section of the signal from a location prior to the detected change to a location after the detected change;
extracting a pre-event portion of the first section, the pre-event portion being at least a part of the first section of the signal prior to the change;
extracting a post-event portion of the first section, the post-event portion being at least a part of the first section of the signal after the change;
transforming each of the pre-event portion and the post-event portion into the frequency domain;
subtracting the frequency domain pre-event portion from the frequency domain post-event portion to give a resultant frequency spectrum;
determining a probability that the appliance or a component of the appliance is in the or each of one or more degradation states, by applying a classifier to a feature vector comprising information relating to the resultant frequency spectrum.

30. An appliance operation signal processing method, comprising:
receiving an appliance operation signal, the appliance operation signal comprising information relating to operation of an appliance;
monitoring an input appliance operation signal for a change in magnitude;
if a change is detected:
extracting a first section of the input signal, the first section being a section of the signal from a location prior to the detected change to a location after the detected change;
extracting a pre-event portion of the first section, the pre-event portion being at least a part of the first section of the signal prior to the change;
extracting a post-event portion of the first section, the post-event portion being at least a part of the first section of the signal after the change;
subtracting the pre-event portion from the post-event portion to give a resultant time domain signal;
determining a probability that the appliance is in the or each of one or more degradation states, by applying a classifier to a feature vector comprising information relating to the resultant time domain signal.

31. A method of training a machine learning classifier to determine a probability that an appliance is in the or each of one or more degradation states, using a corpus of data comprising appliance operation signals comprising information relating to operation of an appliance and annotated with degradation states and normal operation states; the method comprising:
monitoring an input appliance operation signal for a change in magnitude;
if a change is detected:
extracting an event section of the input signal, the event section comprising a section of the signal from a point prior to the change to a point after the change;
extracting a pre-event portion of the event section, the pre-event portion being a portion of the event section of the signal which is prior to the change;
extracting a post-event portion of the event section, the post-event portion being a portion of the event section of the signal which is after the change;

transforming each of the pre-event portion and the post-event portion into the frequency domain;
subtracting the frequency domain pre-event portion from the frequency domain post-event portion to give a resultant frequency spectrum;
determining a probability that the appliance is in the or each of one or more degradation states, by applying the machine learning classifier to a feature vector comprising information relating to the resultant frequency spectrum;
training the machine learning classifier using the annotations.

32. A method of training a machine learning classifier to determine a probability that an appliance is in the or each of one or more degradation states, using a corpus of data comprising appliance operation signals comprising information relating to operation of an appliance and annotated with degradation states and normal operation states; the method comprising:
monitoring an input appliance operation signal for a change in magnitude;
if a change is detected:
extracting an event section of the input signal, the event section comprising a section of the signal from a point prior to the change to a point after the change;
extracting a pre-event portion of the event section, the pre-event portion being a portion of the event section of the signal which is prior to the change;
extracting a post-event portion of the event section, the post-event portion being a portion of the event section of the signal which is after the change;
subtracting the pre-event portion from the post-event portion to give a resultant time domain signal;
determining a probability that the appliance is in the or each of one or more degradation states, by applying the machine learning classifier to a feature vector comprising information relating to the resultant time domain signal;
training the machine learning classifier using the annotations.

33. A carrier medium comprising computer readable code configured to cause a computer to perform the method of any of clauses 29 to 32.

While certain embodiments have been described, these embodiments have been presented by way of example only, and are not intended to limit the scope of the inventions. Indeed the novel methods and apparatus described herein may be embodied in a variety of other forms; furthermore, various omissions, substitutions and changes in the form of methods and apparatus described herein may be made.

The invention claimed is:

1. An appliance operation signal processing system comprising:
an input for receiving an appliance operation signal, the appliance operation signal comprising information relating to operation of an appliance;
an output for outputting information relating to degradation of the appliance; and
a processor configured to determine a probability that the appliance or a component of the appliance is in a degradation state, by applying a classifier to a feature vector comprising information relating to frequency data extracted from the appliance operation signal,
wherein the appliance operation signal comprises an electrical current signal and/or an electrical voltage signal and/or an electrical power signal.

2. The system according to claim 1, wherein the processor is further configured to:
monitor an input appliance operation signal for a change in magnitude;
if a change is detected:
extract a first section of the input signal, the first section being a section of the signal from a location prior to the detected change to a location after the detected change;
extract a pre-event portion of the first section, the pre-event portion being at least a part of the first section of the signal prior to the change;
extract a post-event portion of the first section, the post-event portion being at least a part of the first section of the signal after the change;
transform each of the pre-event portion and the post-event portion into the frequency domain;
subtract one of the frequency domain pre-event portion and the frequency domain post-event portion from the other of the frequency domain pre-event portion and the frequency domain post-event portion to give resultant frequency data;
wherein the frequency data extracted from the appliance operation signal is the resultant frequency data.

3. The system according to claim 2, wherein transforming each of the pre-event portion and the post-event portion into the frequency domain comprises using a fast Fourier transform.

4. The system according to claim 2, wherein the information relating to the resultant frequency data comprises the amplitude value corresponding to one or more harmonic frequencies.

5. The system according to claim 4, wherein the fundamental frequency is 50 Hz or 60 Hz.

6. The system according to claim 2, wherein the processor is further configured to:
subtract a time domain signal corresponding to one of the pre-event portion and the post-event portion from a time domain signal corresponding to the other of the pre-event portion and the post-event portion to give resultant time domain data, wherein the feature vector further comprises information relating to the resultant time domain data.

7. An appliance operation signal processing system comprising:
an input for receiving an appliance operation signal, the appliance operation signal comprising information relating to operation of an appliance;
an output for outputting information relating to degradation of the appliance; and
a processor configured to determine a probability that the appliance is in a degradation state, by applying a classifier to a feature vector comprising information relating to time domain data extracted from the appliance operation signal,
wherein the appliance operation signal comprises an electrical current signal and/or an electrical voltage signal and/or an electrical power signal.

8. The system according to claim 7, wherein the processor is further configured to:
monitor an input appliance operation signal for a change in magnitude;
if a change is detected:
extract a first section of the input signal, the first section being a section of the signal from a location prior to the detected change to a location after the detected change;

extract a pre-event portion of the first section, the pre-event portion being at least a part of the first section of the signal prior to the change;

extract a post-event portion of the first section, the post-event portion being at least a part of the first section of the signal after the change;

subtract one of the pre-event portion and the post-event portion from the other of the pre-event portion and the post-event portion to give resultant time domain data;

wherein the time domain data extracted from the appliance operation signal is the resultant time domain data.

9. The system according to claim 8, wherein the processor is further configured to:

transform each of a time domain signal corresponding to the pre-event portion and a time domain signal corresponding to the post-event portion into the frequency domain;

subtract one of the frequency domain pre-event portion and the frequency domain post-event portion from the other of the frequency domain pre-event portion and the frequency domain post-event portion to give resultant frequency data, wherein the feature vector further comprises information relating to the resultant frequency data.

10. The system according to claim 1, wherein the frequency data is a frequency spectrum.

11. The system according to claim 2, wherein monitoring the input appliance operation signal for a change in magnitude comprises monitoring for a change in magnitude greater than a change threshold value.

12. The system according to claim 2, wherein the processor is further configured to extract information relating to the duration of time between detected changes for the appliance, wherein the feature vector further comprises the extracted information relating to the duration of time between events.

13. The system according to claim 1, wherein the appliance consumes water and the appliance operation signal comprises a water consumption signal.

14. The system according to claim 13, wherein the processor is further configured to, if a change is detected in an electrical signal, determine, from the water consumption signal, the amount of water contained in the appliance at the time of the change, wherein the feature vector further comprises information relating to amount of water contained in the appliance.

15. The system according to claim 1, wherein the appliance consumes gas and wherein the appliance operation signal comprises a gas consumption signal.

16. The system according to claim 1, wherein the classifier is a machine learning classifier.

17. The system according to claim 1, wherein the appliance operation signal comprises information relating to utility consumption of a plurality of appliances and wherein the processor is further configured to identify the appliance corresponding to a detected event.

18. The system according to claim 17, wherein the classifier is further configured to determine a probability that the detected event corresponds to at least one of the plurality of appliances.

19. The system according to claim 1, wherein the appliance operation signal is a continuously sampled time domain signal.

20. The system according to claim 19, wherein the sampling frequency is at least 50 Hz or at least 60 Hz.

21. The system according to claim 1, wherein the output comprises a transmitter.

22. The system according to claim 1, wherein the output comprises a display.

23. The system according to claim 2, wherein the location prior to the detected change and the location after the detected change are a fixed duration before and after the detected change.

24. The system according to claim 1, wherein a degradation state is a state of operation of the appliance or component of the appliance which deviates from normal operation.

25. The system according to claim 1, wherein the processor is further configured to:

determine whether the probability that the appliance or the component of the appliance is in a degradation state is higher than a probability threshold value.

26. The system according to claim 1, wherein the processor is further configured to:

determine whether the probability that the appliance or the component of the appliance is in a degradation state is increasing between detected changes for the appliance or the component of the appliance.

27. The system according to claim 1, wherein the output information relating to degradation of the appliance is generated using one or more determined probabilities that the appliance or component of the appliance is in a degradation state.

* * * * *